United States Patent
Sato et al.

(10) Patent No.: US 12,249,973 B2
(45) Date of Patent: Mar. 11, 2025

(54) ACOUSTIC WAVE DEVICE, FILTER, AND MULTIPLEXER

(71) Applicant: TAIYO YUDEN CO., LTD., Tokyo (JP)

(72) Inventors: Koichi Sato, Tokyo (JP); Shinji Yamamoto, Tokyo (JP); Toshio Nishizawa, Tokyo (JP); Ryohei Komiyama, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 549 days.

(21) Appl. No.: 17/724,346

(22) Filed: Apr. 19, 2022

(65) Prior Publication Data

US 2022/0368307 A1 Nov. 17, 2022

(30) Foreign Application Priority Data

May 13, 2021 (JP) ................. 2021-081511

(51) Int. Cl.
*H03H 9/13* (2006.01)
*H03H 9/17* (2006.01)
*H03H 9/70* (2006.01)

(52) U.S. Cl.
CPC ................ *H03H 9/13* (2013.01); *H03H 9/17* (2013.01); *H03H 9/703* (2013.01)

(58) Field of Classification Search
CPC ............ H03H 9/13; H03H 9/17; H03H 9/703; H03H 9/02622; H03H 9/02157; H03H 9/02834; H03H 9/02866; H03H 9/02574
See application file for complete search history.

(56) References Cited

U.S. PATENT DOCUMENTS

| | | | |
|---|---|---|---|
| 2019/0288661 A1 | 9/2019 | Akiyama et al. .. | H03H 9/02614 |
| 2020/0313650 A1 | 10/2020 | Yamamoto et al. ..... | H03H 9/25 |
| 2022/0368307 A1* | 11/2022 | Sato ........................ | H03H 9/13 |
| 2023/0143242 A1* | 5/2023 | Ouchi .................... | H03H 9/564 |
| | | | 333/187 |

(Continued)

FOREIGN PATENT DOCUMENTS

| | | |
|---|---|---|
| JP | H 05-063500 A | 3/1993 |
| JP | 2015-115870 A | 6/2015 |

(Continued)

*Primary Examiner* — Daniel Pihulic
(74) *Attorney, Agent, or Firm* — Stein IP, LLC

(57) ABSTRACT

An acoustic wave device includes a piezoelectric layer, a pair of comb-shaped electrodes disposed on a first surface of the piezoelectric layer, each of the pair of comb-shaped electrodes including electrode fingers that excite an acoustic wave, a support substrate disposed at a second surface side of the piezoelectric layer, and having protruding portions and/or recessed portions on a first surface, which is closer to the piezoelectric layer, of the support substrate, each of the protruding portions and/or the recessed portions having a shape in which each of left and right side surfaces has linear slopes inclined at different angles with respect to the first surface of the piezoelectric layer in a cross-sectional view, and a second insulating layer located between the piezoelectric layer and the support substrate and disposed on the third surface, on which the protruding portions and/or the recessed portions are formed, of the support substrate.

16 Claims, 15 Drawing Sheets

(56) References Cited

U.S. PATENT DOCUMENTS

2023/0170878 A1\* 6/2023 Ouchi ................ H03H 9/02015
333/192

FOREIGN PATENT DOCUMENTS

| JP | 2018-061258 A | 4/2018 | | |
|---|---|---|---|---|
| JP | 2020-123855 A | 8/2020 | | |
| JP | 2020-161899 A | 10/2020 | | |
| JP | 2022175263 A | \* 11/2022 | ............... | H03H 9/13 |

\* cited by examiner

ACOUSTIC WAVE DEVICE, FILTER, AND MULTIPLEXER

CROSS-REFERENCE TO RELATED APPLICATION

This application is based upon and claims the benefit of priority of the prior Japanese Patent Application No. 2021-081511, filed on May 13, 2021, the entire contents of which are incorporated herein by reference.

FIELD

A certain aspect of the present embodiments relates to an acoustic wave device, a filter, and a multiplexer.

BACKGROUND

Surface acoustic wave resonators have been known as acoustic wave resonators used in communication devices such as smartphones. It is known to attach a piezoelectric substrate forming the surface acoustic wave resonator to a support substrate. It is known to provide an intervening layer containing silica between the piezoelectric substrate and the support substrate, and configure both the boundary face between the intervening layer and the piezoelectric substrate and the boundary face between the intervening layer and the support substrate to be uneven as disclosed in, for example, Japanese Patent Application Publication No. 2018-061258 (Patent Document 1). It is known to provide an insulating layer between the support substrate and the piezoelectric layer, and configure the boundary face between the insulating layer and the support substrate to have a pattern that is regularly protruding and recessed as disclosed in, for example, Japanese Patent Application Publication No. 2020-161899 (Patent Document 2).

SUMMARY

Spurious emissions can be reduced by providing protruding portions and/or recessed portions on the insulating layer under the piezoelectric layer. However, the reduction in spurious emissions is not sufficient, and there is still room for improvement.

The present disclosure has been made in view of above problems, and its objective is to reduce spurious emissions.

According to a first aspect of the present disclosure, there is provided an acoustic wave device including: a piezoelectric layer; a pair of comb-shaped electrodes disposed on a first surface of the piezoelectric layer, each of the pair of comb-shaped electrodes including electrode fingers that excite an acoustic wave; a first insulating layer that is disposed at a second surface side of the piezoelectric layer, and has protruding portions and/or recessed portions on a third surface, which is closer to the piezoelectric layer, of the first insulating layer, each of the protruding portions and/or the recessed portions having a shape in which each of left and right side surfaces has linear slopes inclined at different angles with respect to the first surface of the piezoelectric layer in a cross-sectional view; and a second insulating layer located between the piezoelectric layer and the first insulating layer and disposed on the third surface, on which the protruding portions and/or the recessed portions are formed, of the first insulating layer.

According to a second aspect of the present disclosure, there is provided an acoustic wave device including: a piezoelectric layer; a pair of comb-shaped electrodes disposed on a first surface of the piezoelectric layer, each of the pair of comb-shaped electrodes including electrode fingers that excite an acoustic wave; a first insulating layer that is disposed at a second surface side of the piezoelectric layer, and has first recessed portions on a third surface, which is closer to the piezoelectric layer, of the first insulating layer, each of the first recessed portions having a shape in which each of right and left side surfaces has a first linear slope inclined with respect to the first surface of the piezoelectric layer in a cross-sectional view; and a second insulating layer that is located between the piezoelectric layer and the first insulating layer, and has a second recessed portion that has a side surface that is continuous with a side surface of the first recessed portion and has a shape in which each of left and right side surfaces has a second linear slope inclined at an angle different from an angle at which the first linear slope is inclined with respect to the first surface of the piezoelectric layer in a cross-sectional view.

According to a third aspect of the present disclosure, there is provided a filter including the above acoustic wave device.

According a fourth aspect of the present disclosure, there is provided a multiplexer including the above filter.

DETAILED DESCRIPTION

Hereinafter, a description will be given of embodiments of the present disclosure with reference to the accompanying drawings.

First Embodiment

Figure 1A:
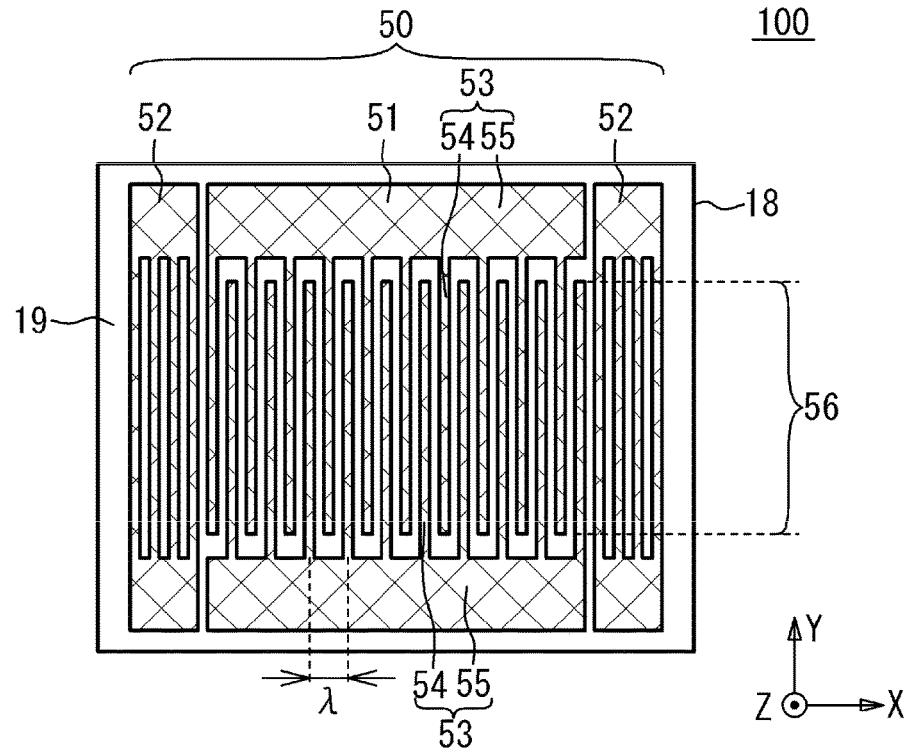
FIG. 1A is a plan view of an acoustic wave device in accordance with a first embodiment.
Figure 1B:
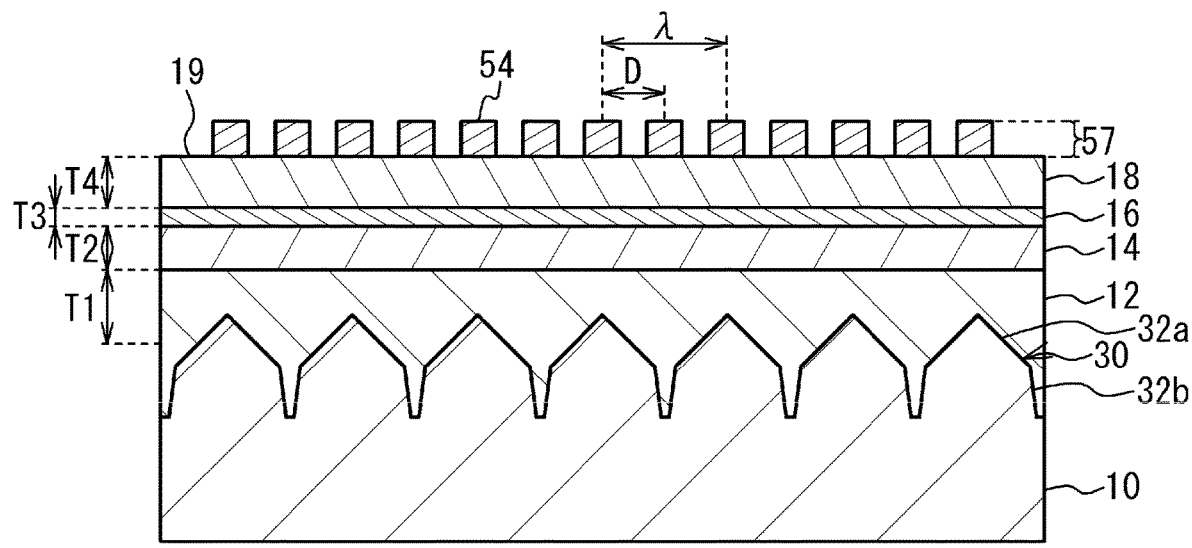
FIG. 1B is a cross-sectional view of the acoustic wave device in accordance with the first embodiment.
Figure 1B:
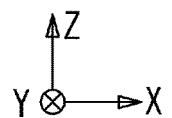

FIG. 1A is a plan view of an acoustic wave device 100 in accordance with a first embodiment, and FIG. 1B is a cross-sectional view of the acoustic wave device 100 in accordance with the first embodiment. The direction in which electrode fingers are arranged (the arrangement direction of the electrode fingers) is defined as an X direction, the direction in which the electrode fingers extend (the extension direction of the electrode fingers) is defined as a Y direction, and the direction in which a support substrate and a piezoelectric layer are stacked (the stack direction of the support substrate and the piezoelectric layer) is defined as a Z direction. The X direction, the Y direction, and the Z direction do not necessarily correspond to the X-axis orientation or the Y-axis orientation of the crystal orientation of the piezoelectric layer. In the case that the piezoelectric layer is a rotated Y-cut X-propagation layer, the X direction is the X-axis orientation of the crystal orientation.

As illustrated in FIG. 1A and FIG. 1B, in the acoustic wave device 100, a piezoelectric layer 18 is provided over a support substrate 10. A temperature compensation layer 14 is interposed between the support substrate 10 and the piezoelectric layer 18. A boundary layer 12 is interposed between the temperature compensation layer 14 and the support substrate 10. A bonding layer 16 is interposed between the temperature compensation layer 14 and the piezoelectric layer 18, but the bonding layer 16 may be omitted.

Protruding portions 30 are formed on the upper surface of the support substrate 10. The protruding portions 30 are regularly arranged. The boundary layer 12 is provided on the upper surface of the support substrate 10 to fill in the space between the protruding portions 30. Therefore, the boundary face between the support substrate 10 and the boundary layer 12 is uneven. The boundary face between the boundary layer 12 and the temperature compensation layer 14 is flat, and the boundary face between the temperature compensation layer 14 and the piezoelectric layer 18 or the bonding layer 16 is flat.

An acoustic wave resonator 50 is disposed on a surface 19 of the piezoelectric layer 18. The acoustic wave resonator 50 includes an interdigital transducer (IDT) 51 and reflectors 52. The reflectors 52 are located at both sides of the IDT 51 in the X direction. The IDT 51 and the reflectors 52 are formed of a metal film 57 on the piezoelectric layer 18.

The IDT 51 includes a pair of comb-shaped electrodes 53. The comb-shaped electrode 53 includes a plurality of electrode fingers 54 and a bus bar 55 to which the electrode fingers 54 are coupled. An overlap region 56 is a region where one of the pair of the comb-shaped electrodes 53 overlaps with the other of the pair of the comb-shaped electrodes 53. The length of the overlap region 56 is an aperture length. The pair of the comb-shaped electrodes 53 is located to face each other so that the electrode fingers 54 of one of the pair of the comb-shaped electrodes 53 and the electrode fingers 54 of the other of the pair of the comb-shaped electrodes 53 are substantially alternately arranged in at least a part of the overlap region 56. The acoustic wave excited by the electrode fingers 54 in the overlap region 56 propagates mainly in the X direction. The pitch of the electrode fingers 54 of one of the pair of the comb-shaped electrodes 53 is approximately equal to the wavelength λ of the acoustic wave. The pitch D of the electrode fingers 54 is two times the pitch of the electrode fingers 54 of one of the pair of the comb-shaped electrodes 53. The reflectors 52 reflect the acoustic wave (the surface acoustic wave) excited by the electrode fingers 54 of the IDT 51. Thus, the acoustic wave is confined within the overlap region 56 of the IDT 51.

Figure 2:
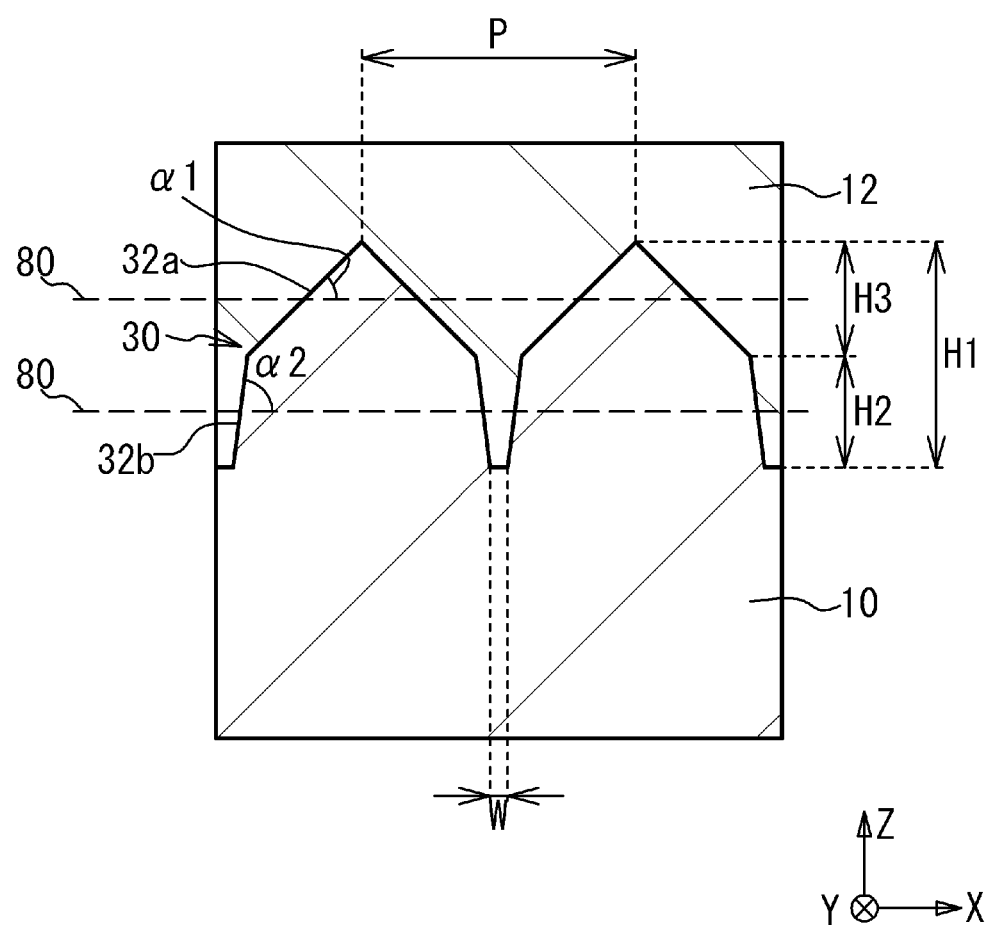
FIG. 2 is an enlarged cross-sectional view of the vicinity of protruding portions provided on a support substrate in the first embodiment.

FIG. 2 is an enlarged cross-sectional view of the vicinity of the protruding portions 30 provided on the support substrate 10 in the first embodiment. As illustrated in FIG. 1B and FIG. 2, each of the protruding portions 30 provided on the support substrate 10 has a bilaterally-symmetrical shape in a cross-sectional view. The protruding portion 30 has a shape in which each of the left and right side surfaces has linear slopes 32a and 32b that are inclined at different angles with respect to the surface 19, on which the IDT 51 is provided, of the piezoelectric layer 18 in a cross-sectional view. The slope 32a is a slope that forms a step closer to the tip of the protruding portion 30, and the slope 32b is a slope that forms a step farther from the tip of the protruding portion 30. Each step may be formed of only the corresponding one of the linear slopes 32a and 32b, or may partially include a curved portion. The linear slope is not limited to a completely straight slope, but may be a substantially linear slope having a curvature or a level difference within a manufacturing error. The angle α1 between a virtual straight line 80, which is parallel to the surface 19 of the piezoelectric layer 18, and the slope 32a and the angle α2 between the virtual straight line 80 and the slope 32b are equal to or greater than 45° and less than 90°. The angle α1 between the virtual straight line 80 and the slope 32a is smaller than the angle α2 between the virtual straight line 80 and the slope 32b. The angle α1 corresponds to a first angle, which is the slope angle of the slope 32a, of two angles between the slope 32a and the surface 19 of the piezoelectric layer 18. In other words, the angle α1 is an angle that is inside the support substrate 10 of two angles between the slope 32a and the surface 19 of the piezoelectric layer 18. The angle α2 corresponds to a second angle, which is the slope angle of the slope 32b, of two angles between the slopes 32b and the surface 19 of the piezoelectric layer 18. In other words, the angle α2 is an angle that is inside the support substrate 10 of two angles between the slopes 32b and the surface 19 of the piezoelectric layer 18.

A regular interval P between the protruding portions 30 is, for example, equal to or greater than 0.3λ (λ is the wavelength of the acoustic wave). The height H1 of the protruding portion 30 is, for example, equal to or greater than 0.1λ.

The height H2 of the lower tapered portion of the protruding portion 30 is, for example, equal to or greater than 0.01λ.

As illustrated in FIG. 1B, T1 represents the thickness of the boundary layer 12, T2 represents the thickness of the temperature compensation layer 14, T3 represents the thickness of the bonding layer 16, and T4 represents the thickness of the piezoelectric layer 18. Since the thickness of the boundary layer is not uniform, the average thickness of the boundary layer 12 is defined as the thickness T1. For example, the thickness T1 of the boundary layer 12 can be obtained by dividing the sum of the thickness from the tip of the protruding portion 30 to the temperature compensation layer 14 and the thickness from the bottom surface between the adjacent protruding portions 30 to the temperature compensation layer 14 by two.

The piezoelectric layer 18 is, for example, a monocrystalline lithium tantalate ($LiTaO_3$) layer or a monocrystalline lithium niobate ($LiNbO_3$) layer, and is, for example, a rotated Y-cut X-propagation lithium tantalate layer or a rotated Y-cut X-propagation lithium niobate layer.

The support substrate 10 is, for example, a sapphire substrate, a silicon substrate, a spinel substrate, a quartz substrate, a crystal substrate, an alumina substrate, or a silicon carbide substrate. The sapphire substrate is a monocrystalline $Al_2O_3$ substrate. The silicon substrate is a monocrystalline or polycrystalline silicon substrate. The spinel substrate is a polycrystalline $MgAl_2O_4$ substrate. The quartz substrate is an amorphous $SiO_2$ substrate. The crystal substrate is a monocrystalline $SiO_2$ substrate. The alumina substrate is a polycrystalline or amorphous $Al_2O_3$ substrate. The silicon carbide substrate is a polycrystalline or monocrystalline SiC substrate. The linear expansion coefficient in the X direction of the support substrate 10 is less than the linear expansion coefficient in the X direction of the piezoelectric layer 18. Therefore, the frequency temperature dependence of the acoustic wave resonator 50 can be reduced.

The temperature compensation layer 14 has a temperature coefficient of elastic constant opposite in sign to the temperature coefficient of elastic constant of the piezoelectric layer 18. For example, the temperature coefficient of elastic constant of the piezoelectric layer 18 has a negative value, while the temperature coefficient of elastic constant of the temperature compensation layer 14 has a positive value. The temperature compensation layer 14 is, for example, an insulating layer mainly composed of a silicon oxide ($SiO_2$), is, for example, an additive-free silicon oxide ($SiO_2$) layer or a silicon oxide ($SiO_2$) layer containing additive elements such as fluorine, and is, for example, an amorphous layer. When the temperature compensation layer 14 is an insulating layer mainly composed of a silicon oxide, the acoustic velocity of the bulk wave propagating through the temperature compensation layer 14 is less than the acoustic velocity of the bulk wave propagating through the piezoelectric layer 18.

In order to cause the temperature compensation layer 14 to function as a temperature compensator, it is required for the energy of the surface acoustic wave (the acoustic wave that is the primary mode) excited by the IDT 51 within the piezoelectric layer 18 to exist within the temperature compensation layer 14 to some extent. Although it depends on the type of the surface acoustic wave, the section where the energy of the surface acoustic wave exists is typically from the upper surface of the piezoelectric layer 18 to a depth of approximately 2λ (λ is the wavelength of the acoustic wave). In particular, the energy of the surface acoustic wave gathers in the section from the upper surface of the piezoelectric layer 18 to a depth of λ. Therefore, to confine the energy of the acoustic wave within the piezoelectric layer 18 and the temperature compensation layer 14, a distance between the surface closer to the support substrate 10 of the temperature compensation layer 14 and the surface closer to the comb-shaped electrode 53 of the piezoelectric layer 18 (T2+T3+T4) is preferably equal to or less than 4 times (2λ) the average pitch D of a plurality of the electrode fingers 54, more preferably equal to or less than 3 times (1.5λ) the average pitch D of the plurality of the electrode fingers 54. The average pitch D of the plurality of the electrode fingers 54 is calculated by dividing the width of the IDT 51 in the X direction by the number of the electrode fingers 54.

In order to allow the energy of the acoustic wave to exist within the temperature compensation layer 14, the thickness T4 of the piezoelectric layer 18 is preferably equal to or less than 2 times (λ) the average pitch D of the electrode fingers 54, more preferably equal to or less than 1.2 times (0.6λ) the average pitch D of the electrode fingers 54. When the piezoelectric layer 18 is too thin, the acoustic wave is not excited. Therefore, the thickness T4 of the piezoelectric layer 18 is preferably equal to or greater than 0.2 times (0.1λ) the average pitch D of the electrode fingers 54.

The IDT 51 also excites unnecessary waves such as the bulk wave when the IDT 51 excites the surface acoustic wave. The unnecessary wave such as the bulk wave exists in the section from the upper surface of the piezoelectric layer 18 to a depth of 10λ or greater. When the unnecessary wave downwardly propagates through the layers, the energy of the acoustic wave leaks, and the loss of the acoustic wave increases. Meanwhile, when the bulk wave is reflected by the boundary faces between the layers from the piezoelectric layer 18 to the support substrate 10 and returns to the IDT 51, the returned bulk wave causes spurious emissions.

The acoustic velocity of the bulk wave propagating through the boundary layer 12 is greater than the acoustic velocity of the bulk wave propagating through the temperature compensation layer 14. Therefore, the acoustic wave is more likely to be confined within the piezoelectric layer 18 and the temperature compensation layer 14. The acoustic velocity of the bulk wave propagating through the boundary layer 12 is preferably equal to or greater than 1.1 times the acoustic velocity of the bulk wave propagating through the temperature compensation layer 14, more preferably equal to or greater than 1.2 times the acoustic velocity of the bulk wave propagating through the temperature compensation layer 14, and further preferably equal to or greater than 1.3 times the acoustic velocity of the bulk wave propagating through the temperature compensation layer 14. Too high acoustic velocity of the bulk wave propagating through the boundary layer 12 causes the bulk wave to be likely to be reflected by the boundary face between the boundary layer 12 and the temperature compensation layer 14, which may increase spurious emissions. Therefore, the acoustic velocity of the bulk wave propagating through the boundary layer 12 is preferably equal to or less than 2.0 times the acoustic velocity of the bulk wave propagating through the temperature compensation layer 14, more preferably equal to or less than 1.5 times the acoustic velocity of the bulk wave propagating through the temperature compensation layer 14.

The acoustic velocity of the bulk wave propagating through the boundary layer 12 is less than the acoustic velocity of the bulk wave propagating through the support substrate 10. This allows the bulk wave to be effectively scattered by the protruding portions 30 provided on the support substrate 10, and spurious emissions are thereby reduced. The acoustic velocity of the bulk wave propagating though the support substrate 10 is preferably equal to or greater than 1.1 times the acoustic velocity of the bulk wave propagating through the boundary layer 12, more preferably equal to or greater than 1.2 times the acoustic velocity of the bulk wave propagating through the boundary layer 12, and further preferably equal to or greater than 1.3 times the acoustic velocity of the bulk wave propagating through the boundary layer 12. The acoustic velocity of the bulk wave propagating though the support substrate 10 is preferably equal to or less than 2.0 times the acoustic velocity of the bulk wave propagating through the boundary layer 12. The boundary layer 12 is, for example, a polycrystalline insulating layer or an amorphous insulating layer, and is, for example, an aluminum oxide layer, a silicon layer, an aluminum nitride layer, a silicon nitride layer, or a silicon carbide layer. A plurality of layers of which the materials are different from each other may be provided as the boundary layer 12.

In the case that the thickness T1 of the boundary layer 12 is thin, spurious emissions increase. Therefore, the thickness T1 of the boundary layer 12 is preferably equal to or greater than 0.6 times (0.3λ) the average pitch D of the electrode fingers 54, more preferably equal to or greater than 1.4 times (0.7λ) the average pitch D of the electrode fingers 54, further preferably equal to or greater than 2 times (λ) the average pitch D of the electrode fingers 54, yet further preferably equal to or greater than 4 times (2λ) the average pitch D of the electrode fingers 54.

The acoustic velocity of the bulk wave propagating through the temperature compensation layer 14 may be greater than the acoustic velocity of the bulk wave propagating through the piezoelectric layer 18, but is preferably less than the acoustic velocity of the bulk wave propagating through the piezoelectric layer 18 to cause the acoustic wave to be likely to exist within the temperature concentration layer 14. The acoustic velocity of the bulk wave propagating through the temperature compensation layer 14 is preferably equal to or less than 0.99 times the acoustic velocity of the bulk wave propagating through the piezoelectric layer 18. Too low acoustic velocity of the bulk wave propagating through the temperature compensation layer 14 causes the acoustic wave to be less likely to exist within the piezoelectric layer 18. Therefore, the acoustic velocity of the bulk wave propagating through the temperature compensation layer 14 is preferably equal to or greater than 0.9 times the acoustic velocity of the bulk wave propagating through the piezoelectric layer 18.

The acoustic velocity of the bulk wave propagating through the bonding layer 16 is greater than the acoustic velocity of the bulk wave propagating through the temperature compensation layer 14. The bonding layer 16 is, for example, polycrystalline or amorphous, and is, for example, an aluminum oxide layer, a silicon layer, an aluminum nitride layer, a silicon nitride layer, or a silicon carbide layer. To retain the functions of the piezoelectric layer 18 and the temperature compensation layer 14, the thickness T3 of the bonding layer 16 is preferably equal to or less than 20 nm, more preferably equal to or less than 10 nm. To retain the function as the bonding layer 16, the thickness T3 is preferably equal to or greater than 1 nm, more preferably equal to or greater than 2 nm.

The metal film 57 is a film mainly composed of, for example, aluminum (Al), copper (Cu), or molybdenum (Mo). An adhesion film such as a titanium (Ti) film or a chrome (Cr) film may be interposed between the electrode fingers 54 and the piezoelectric layer 18. The adhesion film is thinner than the electrode fingers 54. An insulating film may be provided so as to cover the electrode fingers 54. The insulating film serves as a protective film or a temperature compensation film.

The wavelength λ of the acoustic wave is, for example, 1 μm to 6 μm. When two electrode fingers 54 are defined as a pair, the number of pairs is, for example, 20 pairs to 300 pairs. The duty ratio of the IDT 51, which is calculated by dividing the width of the electrode finger 54 by the pitch of the electrode fingers 54, is, for example, 30% to 70%. The aperture length of the IDT 51 is, for example, 10λ to 50λ.

Manufacturing Method

Figure 3A:
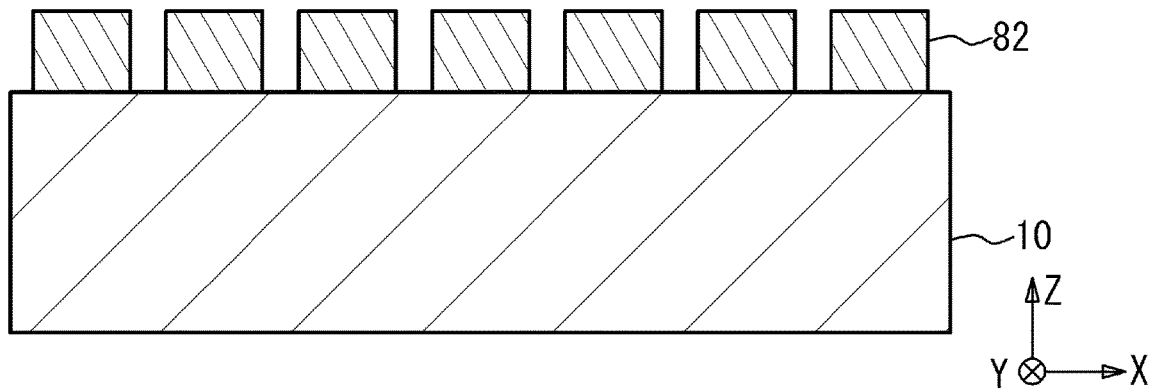
FIG. 3A to FIG. 3C are cross-sectional views (No. 1) illustrating a manufacturing method of the acoustic wave device in accordance with the first embodiment.

FIG. 3A to FIG. 4C are cross-sectional views illustrating a manufacturing method of the acoustic wave device 100 in accordance with the first embodiment. As illustrated in FIG. 3A, the support substrate 10 having a flat upper surface is prepared, and a mask layer 82 having openings is formed on the support substrate 10. The arithmetic average roughness Ra of the upper surface of the support substrate 10 is, for example, equal to or less than 1 nm. The mask layer is, for example, photoresist.

Figure 3B:
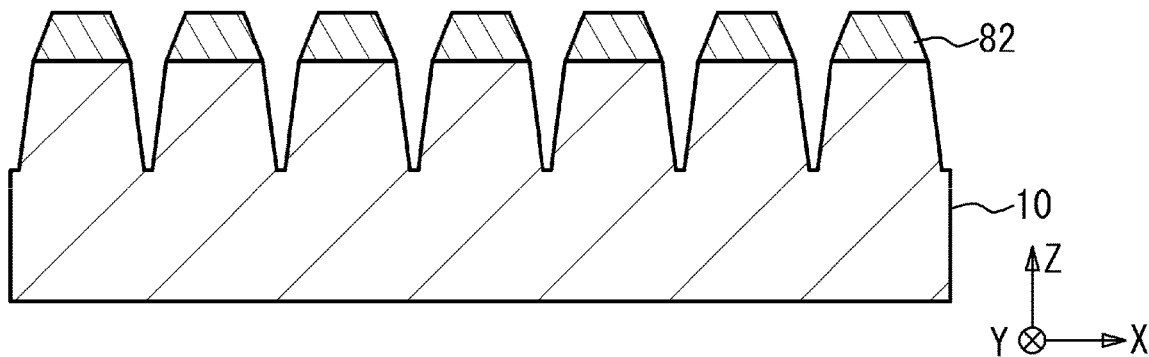

As illustrated in FIG. 3B, the upper part of the support substrate 10 is removed by, for example, etching using the mask layer 82 as a mask. For example, in the case that the support substrate 10 is a sapphire substrate, the upper part of the support substrate 10 is removed by dry etching using chlorine-based gas. At this time, the etching condition that accelerates etching in the thickness direction of the support substrate 10 is employed. For example, etching is performed under the condition in which the gas pressure and/or the bias voltage is set to be high.

Figure 3C:
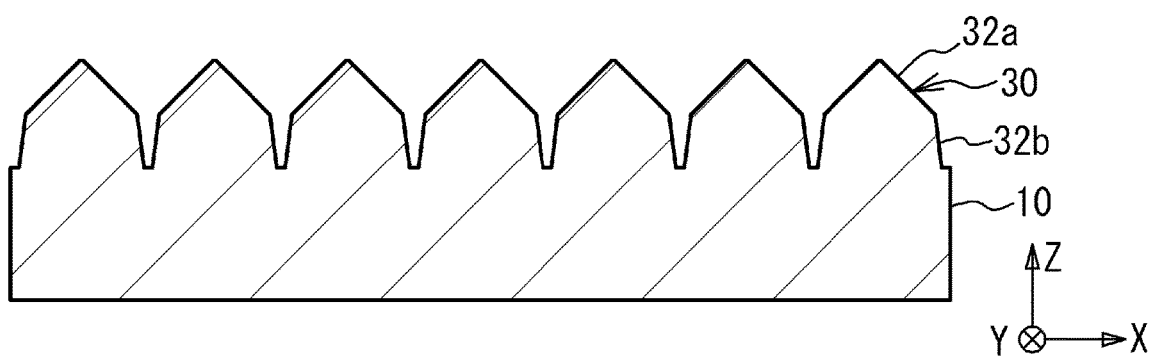

As illustrated in FIG. 3C, the etching condition is changed so that the etching in the direction perpendicular to the thickness direction of the support substrate 10 proceeds faster than that in FIG. 3B, and the upper part of the support substrate 10 is removed by etching using the mask layer 82 as a mask. For example, the etching is performed under the condition in which the gas pressure and/or the bias voltage is set to be low or the condition in which the etching gas ratio is changed. Then, the mask layer 82 is removed. Through this process, the protruding portions 30 each having a shape in which each of the left and right side surfaces has the linear slopes 32a and 32b inclined at different angles in a cross-sectional view are formed on the upper surface of the support substrate 10.

Figure 4A:
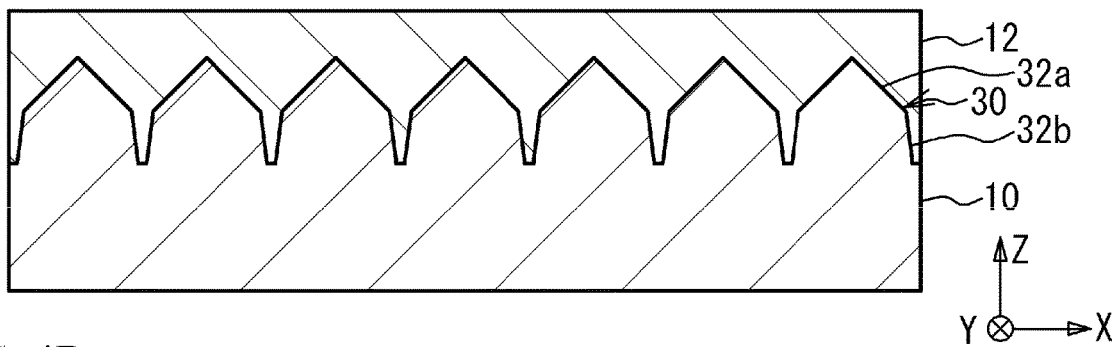
FIG. 4A to FIG. 4C are cross-sectional views (No. 2) illustrating the manufacturing method of the acoustic wave device in accordance with the first embodiment.

As illustrated in FIG. 4A, the boundary layer 12 is formed on the support substrate 10 by, for example, chemical vapor deposition (CVD). The boundary layer 12 is formed on the support substrate 10 so as to fill in the space between the protruding portions 30 formed on the upper surface of the support substrate 10. Then, the upper surface of the boundary layer 12 is flattened by, for example, chemical mechanical polishing (CMP).

Figure 4B:
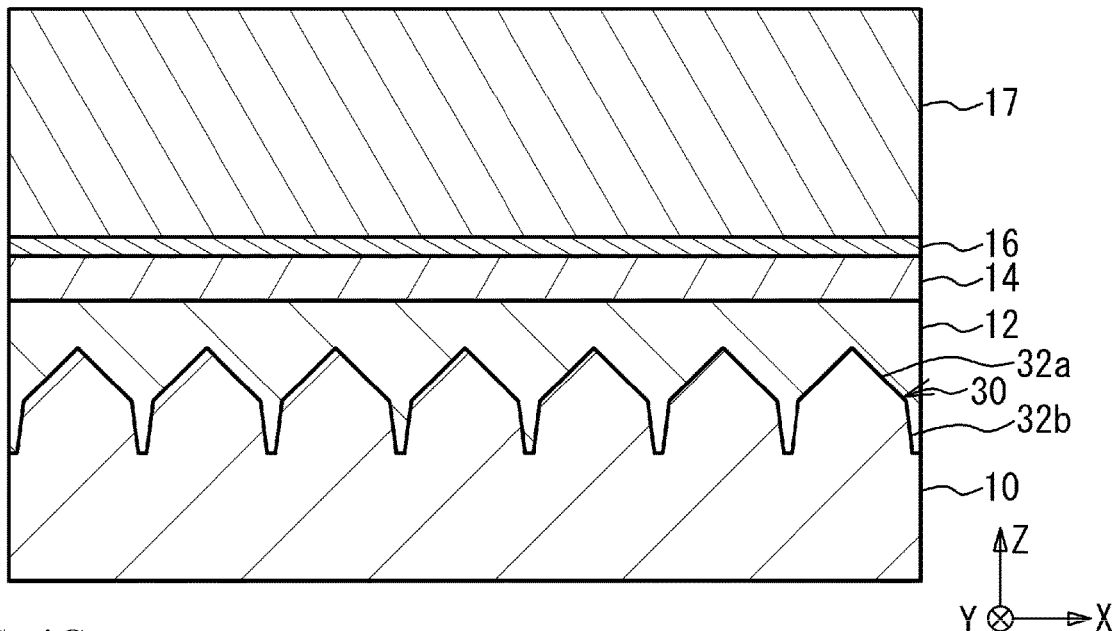

As illustrated in FIG. 4B, the temperature compensation layer 14 is formed on the boundary layer 12 by, for example, sputtering or CVD. Then, a piezoelectric substrate 17 is bonded to the temperature compensation layer 14 via the bonding layer 16. The piezoelectric substrate 17 may be directly bonded to the temperature compensation layer 14 without the bonding layer 16. A surface activation method is employed for the bonding, for example.

Figure 4C:
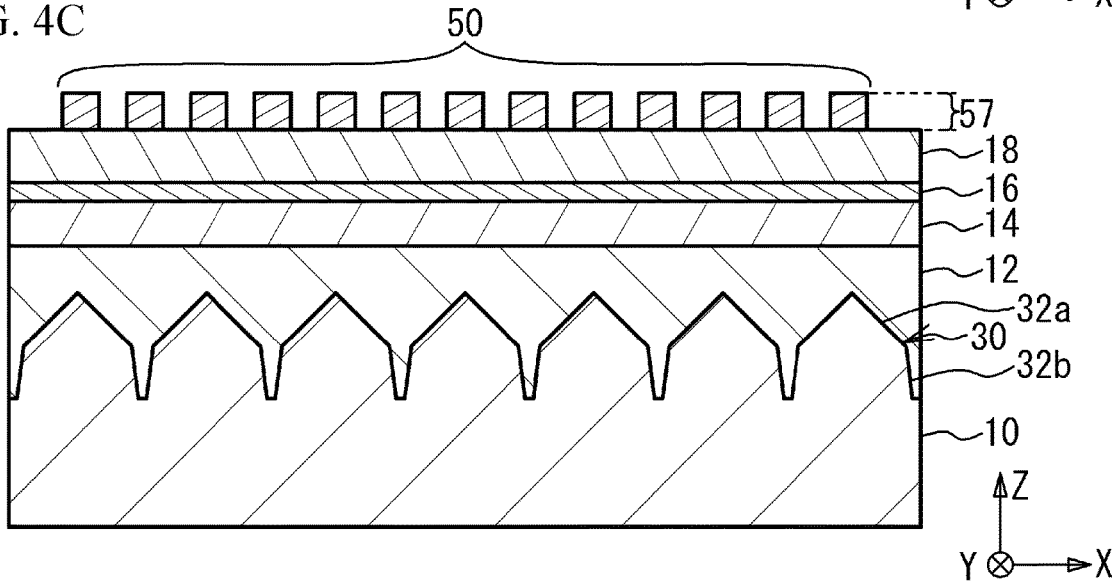

As illustrated in FIG. 4C, the upper surface of the piezoelectric substrate 17 is polished by, for example, CMP to obtain the thinned piezoelectric layer 18. The acoustic wave resonator 50 formed of the metal film 57 is formed on the piezoelectric layer 18. Through the above processes, the acoustic wave device 100 in accordance with the first embodiment is obtained.

Comparative Example

Figure 5:
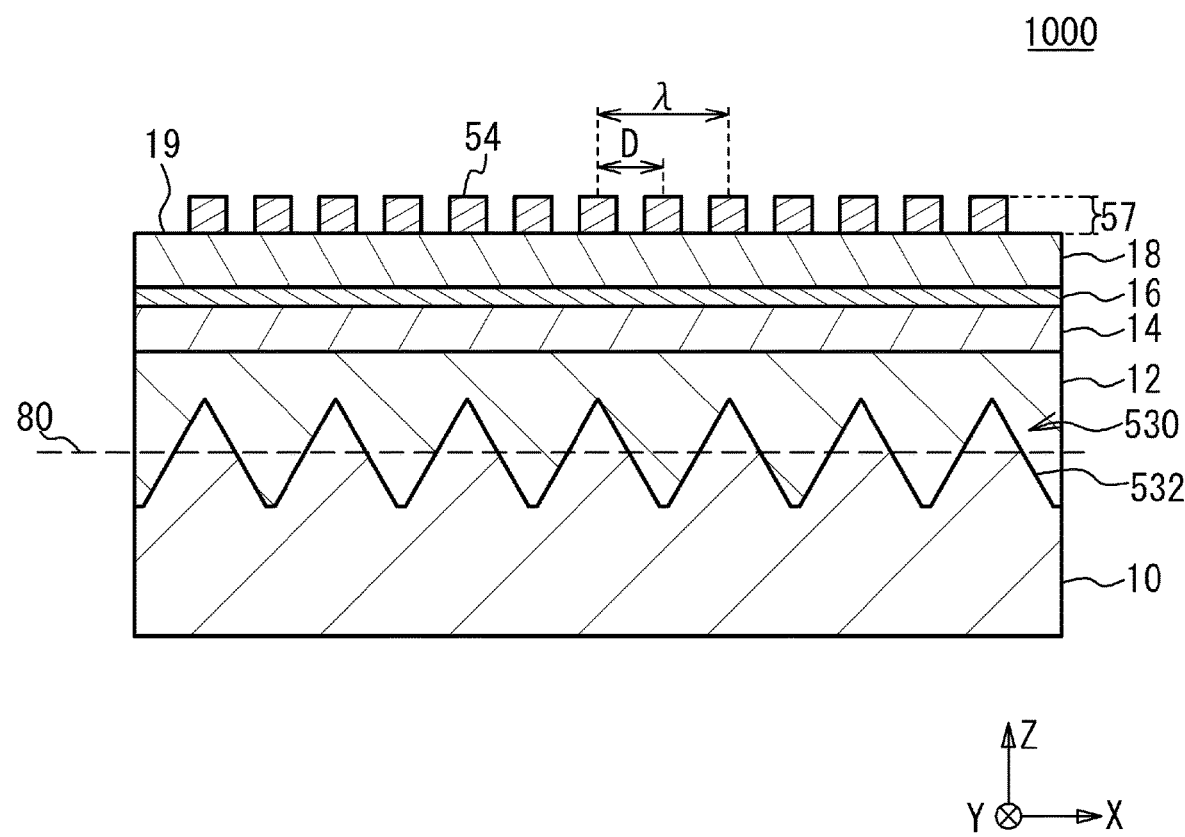
FIG. 5 is a cross-sectional view of an acoustic wave device in accordance with a comparative example.

FIG. 5 is a cross-sectional view of an acoustic wave device 1000 in accordance with a comparative example. As illustrated in FIG. 5, in the acoustic wave device 1000, each of protruding portions 530 formed on the upper surface of the support substrate 10 has a shape in which each of the left and right side surfaces has a linear slope 532 inclined at a constant angle with respect to the virtual straight line 80 in a cross-sectional view. That is, while the protruding portion 30 in the first embodiment has a shape having a side surface tapered in two steps at different angles, the protruding portion 530 in the comparative example has a shape having a side surface tapered in one step at a constant angle. Other structures are the same as those of the first embodiment, and the description thereof is thus omitted.

Description of Reflected Wave

In the comparative example, the whole side surface of the protruding portion 530 is formed to be inclined at a constant angle. Therefore, a single surface reflects the bulk wave, resulting in generation of a constant reflected wave. On the other hand, the side surface of the protruding portion 30 in the first embodiment has slopes inclined at different angles. Therefore, multiple surfaces reflect the bulk wave, resulting in generation of various reflected waves. Therefore, in the first embodiment, the bulk wave can be effectively scattered by the protruding portions 30 formed on the support substrate 10, and spurious emissions are thereby reduced.

In addition, in the case that the slope 32b is inclined at an angle closer to 90 degrees than the slope 32a in the first embodiment, the bulk wave is first reflected by the slope 32a and then immediately reflected by the slope 32b adjacent to the slope 32. Accordingly, various reflected waves are likely to be generated. Therefore, the bulk wave can be scattered more effectively.

Description of Regular Interval Between the Protruding Portions

Figure 6A:
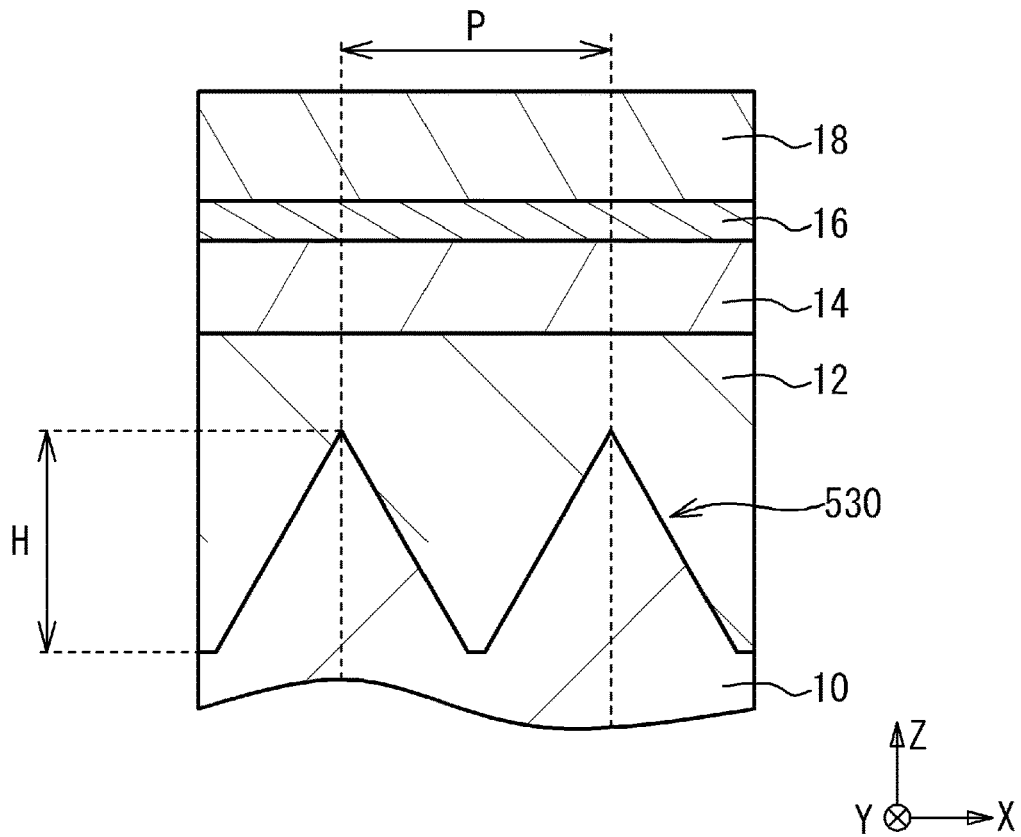
FIG. 6A is a cross-sectional view illustrating a regular interval between protruding portions in the acoustic wave device in accordance with the comparative example.
Figure 6B:
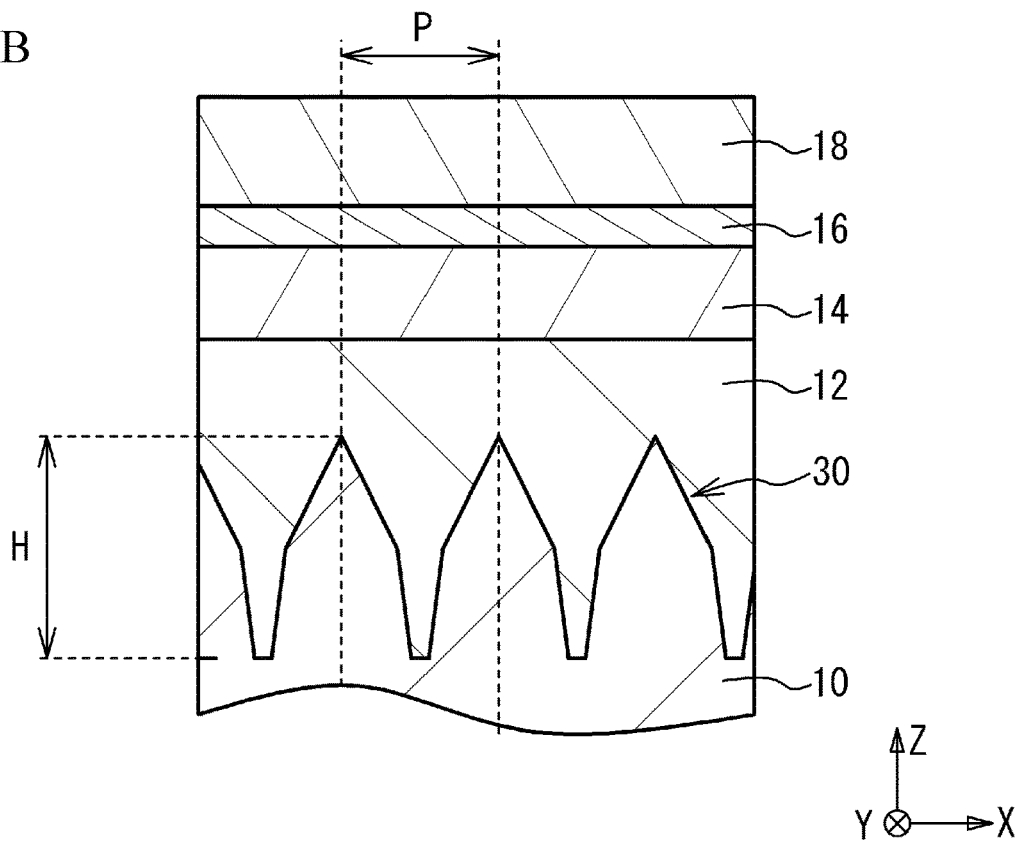
FIG. 6B is a cross-sectional view illustrating a regular interval between the protruding portions in the acoustic wave device in accordance with the first embodiment.

FIG. 6A is a cross-sectional view illustrating the regular interval P between the protruding portions 530 in the acoustic wave device 1000 in accordance with the comparative example. FIG. 6B is a cross-sectional view illustrating the regular interval P between the protruding portions 30 in the acoustic wave device 100 in accordance with the first embodiment. As illustrated in FIG. 6A, in the protruding portions 530 of which the whole side surfaces are formed to be inclined at a constant angle, it is difficult to manufacture the protruding portions 530 with a narrow regular interval P and a high height H because of the durability of the mask layer for forming the protruding portions 530. On the other hand, as illustrated in FIG. 6B, in the protruding portions 30 of which the side surfaces are formed to have slopes inclined at different angles, since the etching condition is changed during the formation of the protruding portions 30, it is possible to form the protruding portions 30 with a narrow regular interval P and a high height H. Accordingly, the regular interval P and the height H of the protruding portion 30 can be designed more freely in the first embodiment. The regular interval P that has an effect of reducing spurious emissions varies depending on the wavelength of the unnecessary wave. Thus, spurious emissions having various wavelengths can be reduced in various wavelength bands in the first embodiment. To reduce spurious emissions, the regular interval P between the protruding portions 30 is preferably equal to or greater than 0.2 times (0.1λ) the average pitch D of the electrode fingers 54, and more preferably equal to or greater than 0.4 times (0.2λ) the average pitch D of the electrode fingers 54. To increase the response in the primary mode, the regular interval P between the protruding portions 30 is preferably equal to or less than 10 times (5λ) the average pitch D of the electrode fingers 54, and more preferably equal to or less than 4 times (2λ) the average pitch D of the electrode fingers 54. The appropriate height H of the protruding portions 30 varies depending on the frequency band in which the acoustic wave device is used (a low band, a middle band, or a high band). Thus, the first embodiment can be applied to acoustic wave devices with various frequency bands.

In the first embodiment, as illustrated in FIG. 1A, FIG. 1B, and FIG. 2, the protruding portions 30 are formed on the upper surface of the support substrate 10 (a first insulating layer). The protruding portion 30 has a shape in which each of the left and right side surfaces has the linear slopes 32a and 32b that are inclined at different angles with respect to the surface 19, on which the comb-shaped electrodes 53 are provided, of the piezoelectric layer 18 in a cross-sectional view. The boundary layer 12 (a second insulating layer) is disposed on the upper surface of the support substrate 10, and the piezoelectric layer 18 is disposed on the boundary layer 12. On the surface 19 of the piezoelectric layer 18, provided is a pair of the comb-shaped electrodes 53 having the electrode fingers 54 that excite the acoustic wave. By forming the protruding portion 30 to have a shape in which each of the left and right side surfaces has the linear slopes 32a and 32b inclined at different angles in a cross-sectional view in this manner, the bulk wave can be effectively scattered. Therefore, spurious emissions can be reduced.

To effectively scatter the bulk wave, the height H2 of the lower tapered portion of the protruding portion 30 (see FIG. 2) is preferably equal to or greater than 10% of the height H1 of the protruding portion 30 (see FIG. 2), more preferably equal to or greater than 30% of the height H1 of the protruding portion 30, and further preferably equal to or greater than 50% of the height H1 of the protruding portion 30. The height H3 of the upper tapered portion of the protruding portion 30 (see FIG. 2) is preferably equal to or greater than 10% of the height H1 of the protruding portion 30, more preferably equal to or greater than 30% of the height H1 of the protruding portion 30, and further preferably equal to or greater than 50% of the height H1 of the protruding portion 30.

In addition, in the first embodiment, the first angle (corresponding to α1 in FIG. 2), which is the slope angle of the the slope 32a, of two angles between the slope 32a and the surface 19, on which the comb-shaped electrodes 53 are provided, of the piezoelectric layer 18 and the second angle (corresponding to α2 in FIG. 2), which is the slope angle of the slope 32b, of two angles between the slope 32b and the surface 19 of the piezoelectric layer 18 are equal to or greater than 45° and less than 90°. This configuration makes the inclination of the side surface of the protruding portion 30 close to 90 degrees. Thus, the bulk wave reflected by the side surface of the protruding portion 30 is inhibited from returning to the IDT 51, and spurious emissions are thereby reduced. To inhibit the bulk wave reflected by the side surface of the protruding portion 30 from returning to the IDT 51, the first and second angles (corresponding to α1 and α2 in FIG. 2, respectively) are preferably equal to or greater than 50° and less than 90°, more preferably equal to or greater than 65° and less than 90°, and further preferably equal to or greater than 75° and less than 90°.

Moreover, in the first embodiment, the second angle (corresponding to α2 in FIG. 2), which is the slope angle of the slope 32b, is greater than the first angle (corresponding to α1 in FIG. 2), which is the slope angle of the slope 32a that is closer to the piezoelectric layer 18 than the slope 32b. In other words, the first and second angles (corresponding to α1 and α2 in FIG. 2, respectively) that are inside the support substrate 10 among the two angles between the slope 32a and the surface 19 of the piezoelectric layer 18 and the two angles between the slope 32b and the surface 19 of the piezoelectric layer 18 increase in the order of the slope 32a, which is closer to the piezoelectric layer 18, and the slope 32b, which is farther from the piezoelectric layer 18. Therefore, when the bulk wave is reflected at a point located away from the piezoelectric layer 18 of the side surface of the protruding portion 30, the reflected bulk wave is immediately reflected by the adjacent side surface, and therefore, various reflected waves are likely to be generated. Thus, the bulk wave can be effectively scattered.

Furthermore, in the first embodiment, as illustrated in FIG. 1B and FIG. 2, the bottom portion formed between the adjacent protruding portions 30 in a cross-sectional view is filled with the boundary layer 12. This structure causes the bulk wave to be reflected by a plurality of surfaces inclined at different angles of the protruding portions 30, and the bulk wave can be therefore effectively scattered.

Variations

Figure 7A:
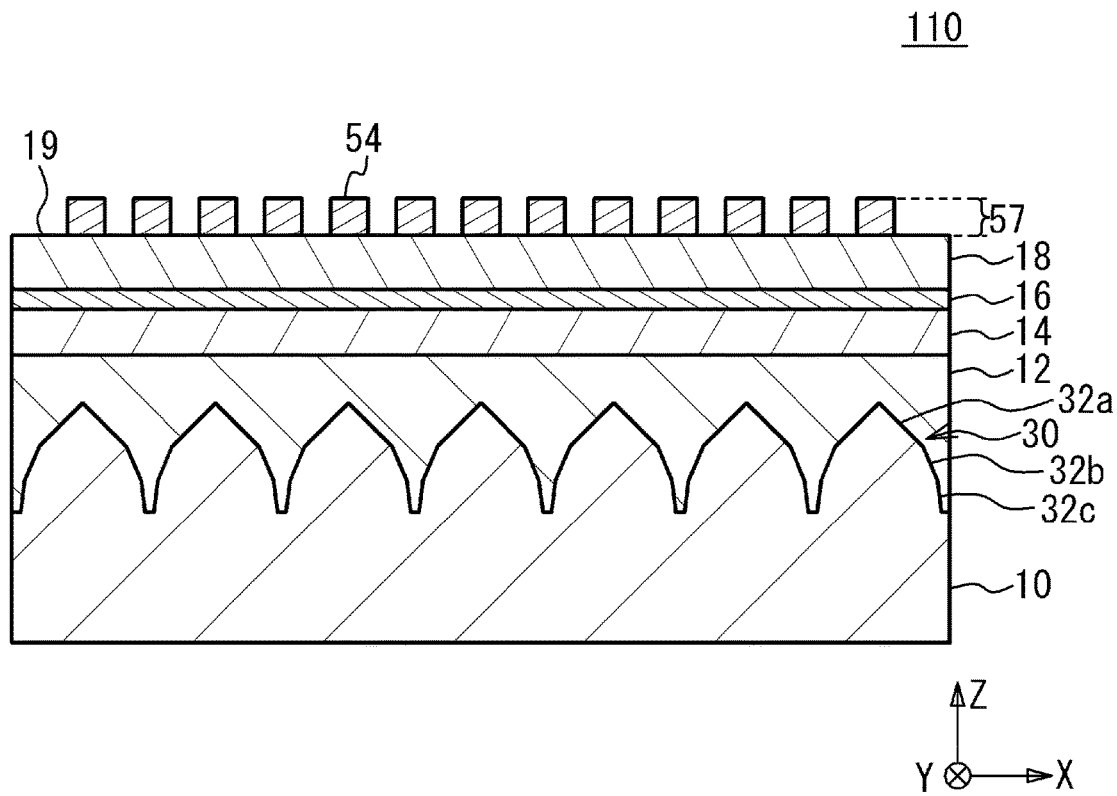
FIG. 7A is a cross-sectional view of an acoustic wave device in accordance with a first variation of the first embodiment.
Figure 7B:
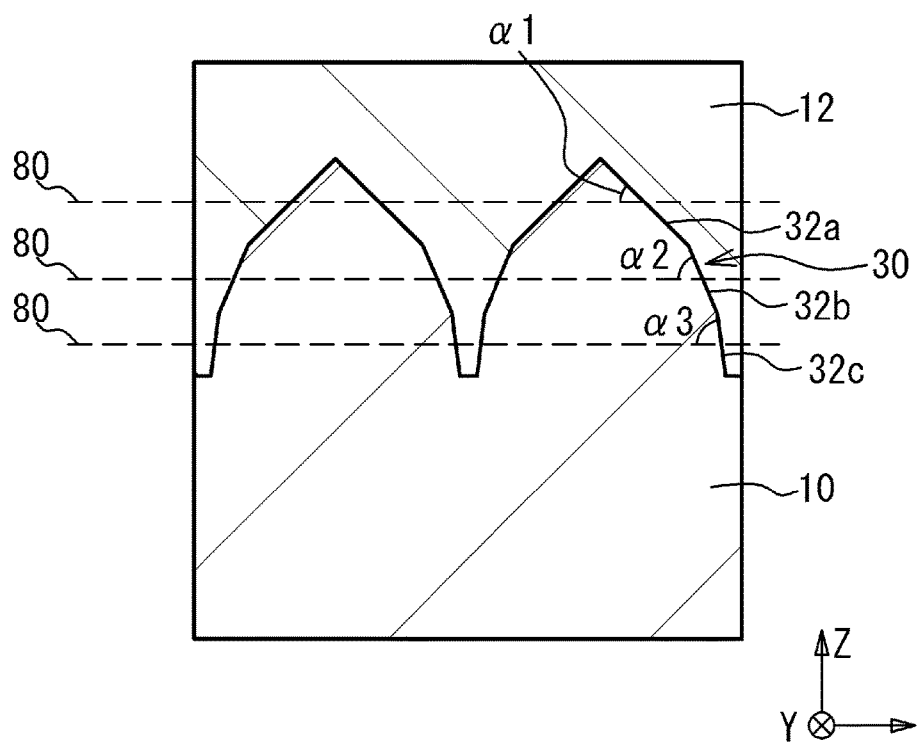
FIG. 7B is an enlarged cross-sectional view of the vicinity of the protruding portions provided on the support substrate in the first variation of the first embodiment.

FIG. 7A is a cross-sectional view of an acoustic wave device 110 in accordance with a first variation of the first embodiment. FIG. 7B is an enlarged cross-sectional view of the vicinity of the protruding portions 30 formed on the support substrate 10 in the first variation of the first embodiment. As illustrated in FIG. 7A and FIG. 7B, in the acoustic wave device 110, each of the protruding portions 30 formed on the support substrate 10 has a shape in which each of the left and right side surfaces has linear slopes 32a, 32b and 32c inclined at different angles in a cross-sectional view. The angle α1 between the virtual straight line 80 and the slope 32a, the angle α2 between the virtual straight line 80 and the slope 32b, and the angle α3 between the virtual straight line 80 and the slope 32c are equal to or greater than 45° and less than 90°. The angle α1 between the virtual straight line 80 and the slope 32a is smaller than the angle α2 between the virtual straight line 80 and the slope 32b, and the angle α2 between the virtual straight line 80 and the slope 32b is smaller than the angle α3 between the virtual straight line 80 and the slope 32c. In this case, the angle α1 or α2 corresponds to a first angle. The angle α3 corresponds to a second angle, which is the slope angle of the slope 32c, of two angles between the slope 32c and the surface 19 of the piezoelectric layer 18. In other words, the angle α3 is an angle that is inside the support substrate 10 of two angles between the slope 32c and the surface 19 of the piezoelectric layer 18. Other structures are the same as those of the first embodiment, and the description thereof is thus omitted.

The first embodiment describes a case in which the protruding portion 30 has a side surface inclined in two steps in a cross-sectional view, but does not intend to suggest any limitation. As in the first variation of the first embodiment, the protruding portion 30 may have a side surface inclined in three steps in a cross-sectional view. As described above, the protruding portions 30 formed on the upper surface of the support substrate 10 are only required to have a shape in which each of the left and right side surfaces has linear slopes inclined at different angles in a cross-sectional view. As the number of slopes inclined at different angles increases, the effect of scattering the bulk wave is enhanced. Thus, the effect of reducing spurious emissions is enhanced.

Figure 8A:
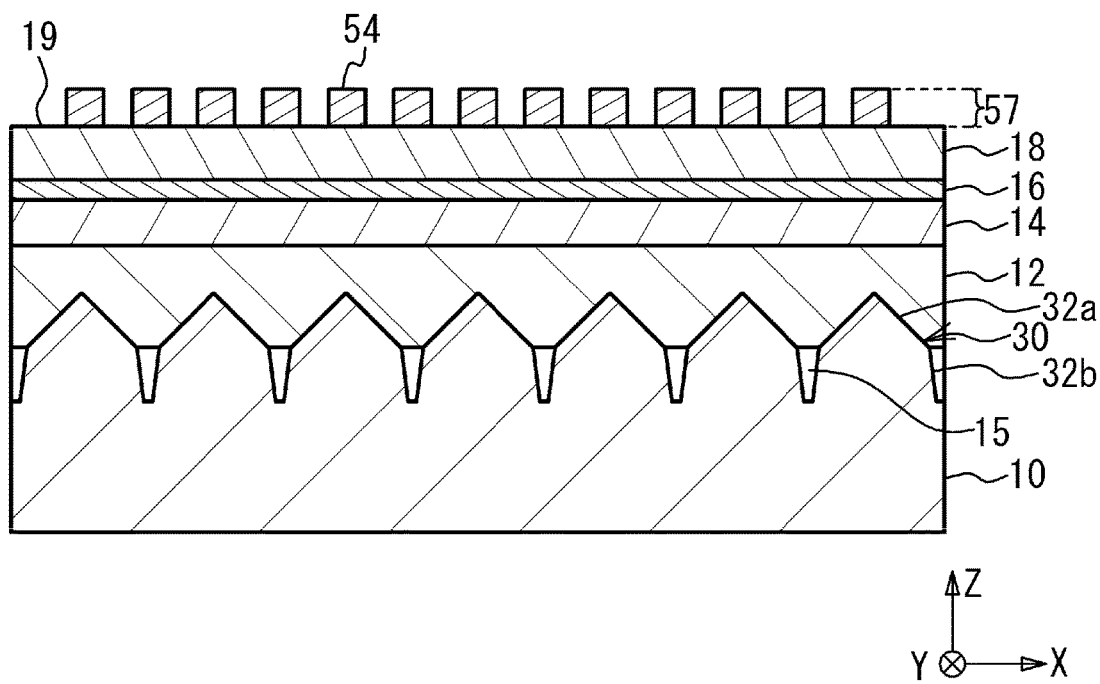
FIG. 8A is a cross-sectional view of an acoustic wave device in accordance with a second variation of the first embodiment.

FIG. 8A is a cross-sectional view of an acoustic wave device 120 in accordance with a second variation of the first embodiment. As illustrate in FIG. 8A, in the acoustic wave device 120, the lower part of the space between the adjacent protruding portions 30 is not filled with the boundary layer 12. That is, the space between the slopes 32a of the adjacent protruding portions 30 is filled with the boundary layer 12, but the space between the slopes 32b of the adjacent protruding portions 30 is not filled with the boundary layer 12. Accordingly, a void space 15 is formed in the lower part of the space between the adjacent protruding portions 30. Other structures are the same as those of the first embodiment, and the description thereof is thus omitted.

Figure 8B:
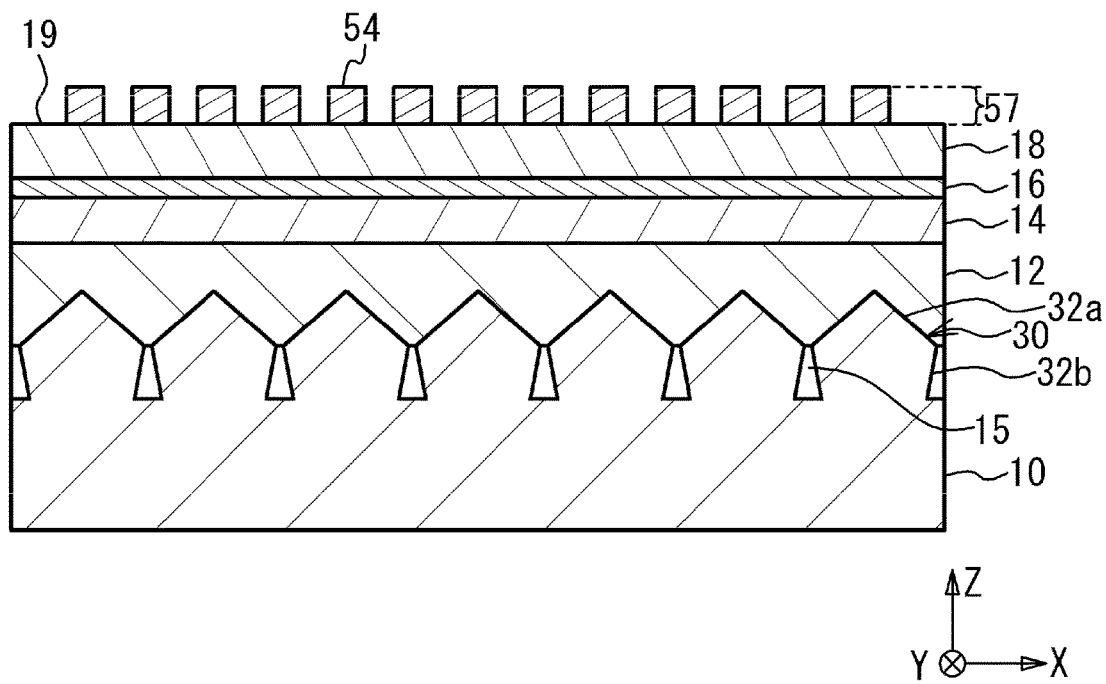
FIG. 8B is a cross-sectional view of an acoustic wave device in accordance with a third variation of the first embodiment.

FIG. 8B is a cross-sectional view of an acoustic wave device 130 in accordance with a third variation of the first embodiment. As illustrate in FIG. 8B, in the acoustic wave device 130, the slope 32b of the protruding portion 30 has an inverted tapered shape, and the space between the slopes 32b of the adjacent protruding portions 30 is not filled with the boundary layer 12, and the void space 15 is formed therein. Other structures are the same as those of the first embodiment, and the description thereof is thus omitted.

As in the second and third variations of the first embodiment, the lower part of the space between the adjacent protruding portions 30 may be the void space 15.

Arrangement Example of the Protruding Portions and the Recessed Portions

Figure 9A:
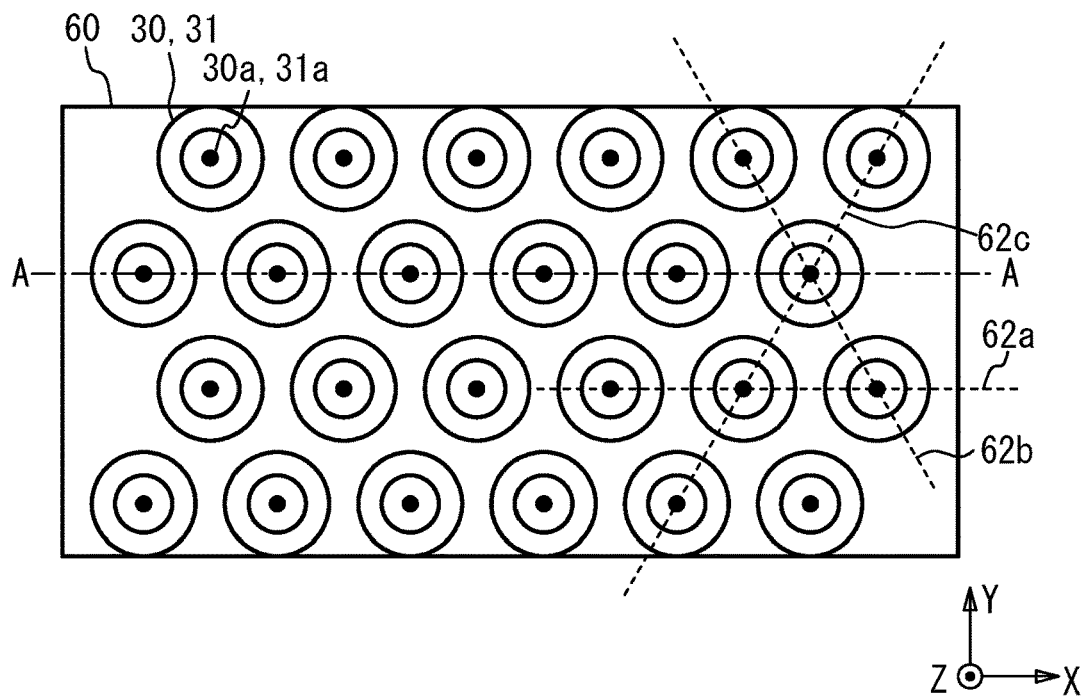
FIG. 9A is a plan view illustrating a first arrangement example of the protruding portions and recessed portions.
Figure 9B:
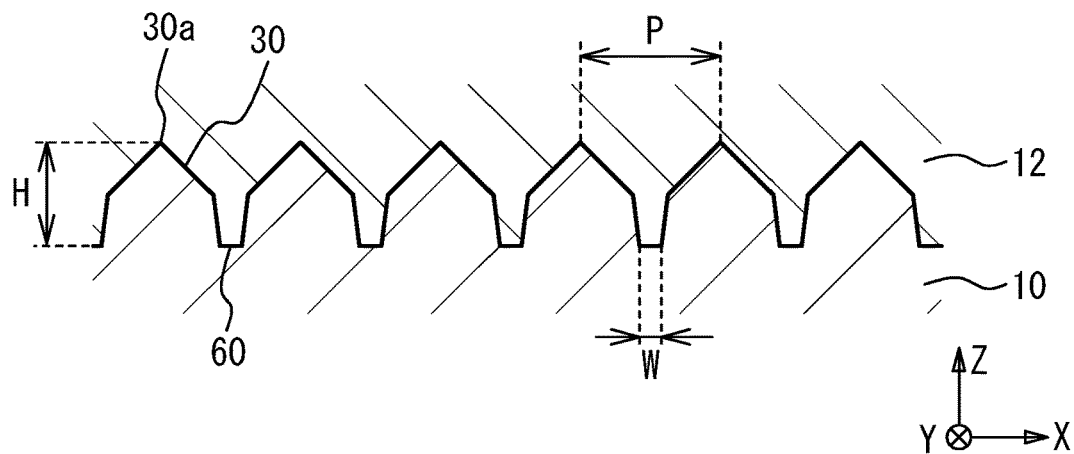
FIG. 9B and FIG. 9C are cross-sectional views taken along line A-A in FIG. 9A.
Figure 9C:
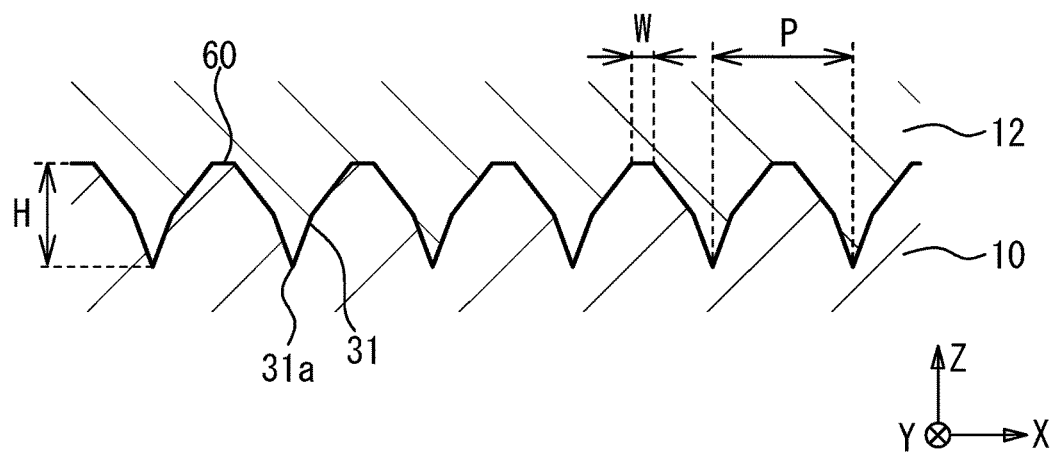

FIG. 9A is a plan view illustrating a first arrangement example of the protruding portions 30 and recessed portions 31, and FIG. 9B and FIG. 9C are cross-sectional views taken along line A-A in FIG. 9A. FIG. 9B is an example of the protruding portions 30, and FIG. 9C is an example of the recessed portions 31.

As illustrated in FIG. 9A to FIG. 9C, instead of the protruding portions 30, the recessed portions 31 may be formed on the upper surface of the support substrate 10. The recessed portion 31 as well as the protruding portion 30 has a bilaterally-symmetrical shape in a cross-sectional view. The protruding portions 30 and the recessed portions 31 are arranged at regular intervals. The three-dimensional shapes of the protruding portion 30 and the recessed portion 31 are the shape of a substantially circular cone having a side surface of which the inclination angle changes. Each of points 30a and 31a is the tip of the substantially circular cone. As illustrated in FIG. 9B, a flat surface 60 has the protruding portions 30. As illustrated in FIG. 9C, the flat surface 60 has the recessed portions 31. The regular interval P between the protruding portions 30 or the regular interval P between the recessed portions 31 are the smallest in three directions 62a, 62b, and 62c. The angle between the directions 62a and 62b, the angle between the directions 62b and 62c, and the angle between the directions 62c and 62a are approximately 60°. The direction 62a is substantially parallel to the X direction. The regular interval P between the protruding portions 30 and the regular interval P between the recessed portions 31 are substantially uniform, the distance W between the protruding portions 30 and the distance W between the recessed portions 31 in the directions 62a to 62c are substantially uniform, and the height H of the protruding portions 30 and the height H of the recessed portions 31 are substantially uniform. The three-dimensional shapes of the protruding portions 30 and the recessed portions 31 may be, for example, the shape of a substantially cone such as a substantially circular cone and a substantially polygonal pyramid, the shape of a substantially circular truncated cone or the shape of a substantially truncated polygonal pyramid. No flat surface 60 may be formed between the protruding portions 30 and between the recessed portions 31.

Figure 10A:
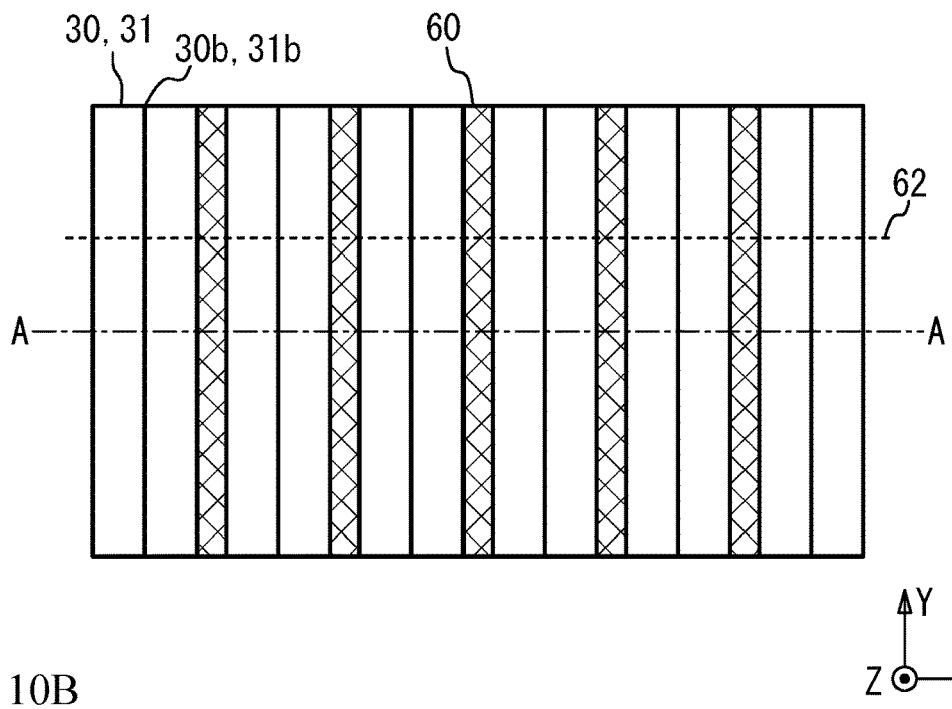
FIG. 10A is a plan view illustrating a second arrangement example of the protruding portions and the recessed portions.
Figure 10B:
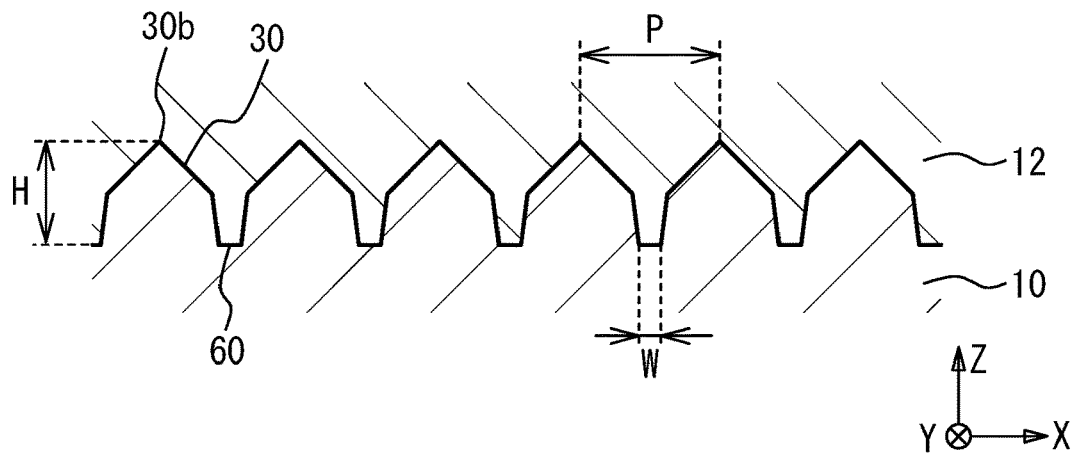
FIG. 10B and FIG. 10C are cross-sectional views taken along line A-A in FIG. 10A.
Figure 10C:
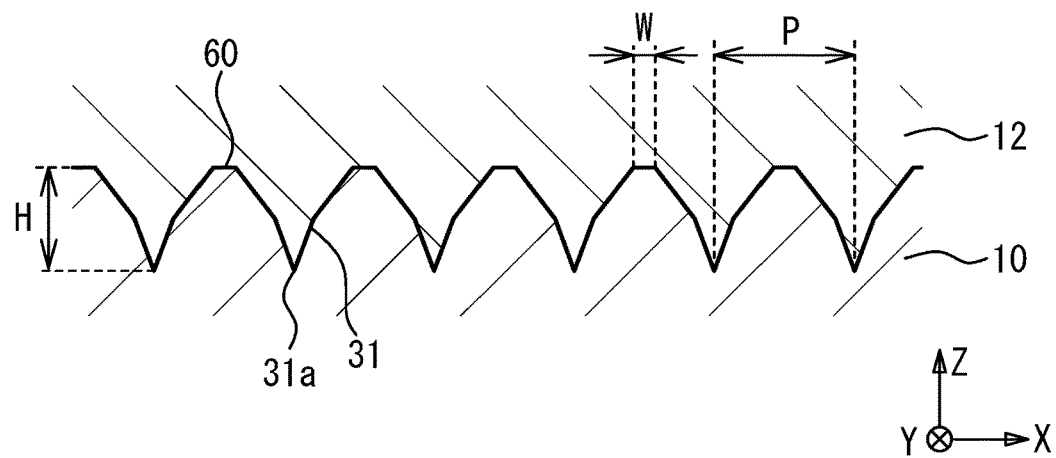

FIG. 10A is a plan view illustrating a second arrangement example of the protruding portions and the recessed portions, and FIG. 10B and FIG. 10C are cross-sectional views taken along line A-A in FIG. 10A. FIG. 10B is an example of the protruding portions 30, and FIG. 10C is an example of the recessed portions 31. In FIG. 10A, the flat surface 60 is hatched for clarity of the drawing.

As illustrated in FIG. 10A to FIG. 10C, the protruding portions 30 and the recessed portions 31 are arranged at regular intervals. The protruding portions 30 and the recessed portions 31 are line-shaped or stripe-shaped. The protruding portions 30 and the recessed portions 31 have a substantially triangular cross-sectional shape having side surfaces of which the inclination angles change. A line 30b is a line connecting the vertices of the substantially triangular shapes in the protruding portion 30, and a line 31b is a line connecting the vertices of the substantially triangular shapes in the recessed portion 31. A direction 62 in which the regular interval P between the protruding portions 30 is the smallest and the direction 62 in which the regular interval P between the recessed portions 31 is the smallest are substantially parallel to the X direction. The regular interval P between the protruding portions 30 and the regular interval P between the recessed portions 31 are substantially uniform, the distance W between the protruding portions 30 in the direction 62 and the distance W between the recessed portions 31 in the direction 62 are substantially uniform, and the height H of the protruding portions 30 and the height H of the recessed portions 31 are substantially uniform. The lines 30b and 31b may be a straight line or a curved line. No flat surface 60 may be formed between the protruding portions 30 and between the recessed portions 31.

Both the protruding portions 30 and the recessed portions 31 may be formed on the upper surface of the support substrate 10, instead of forming the protruding portions 30 or the recessed portions 31 on the upper surface of the support substrate 10. In the case that the recessed portions 31 are formed on the upper surface of the support substrate 10, to effectively scatter the bulk wave, the boundary layer 12 preferably fills in the bottom portions of the recessed portions 31 in a cross-sectional view.

Second Embodiment

Figure 11:
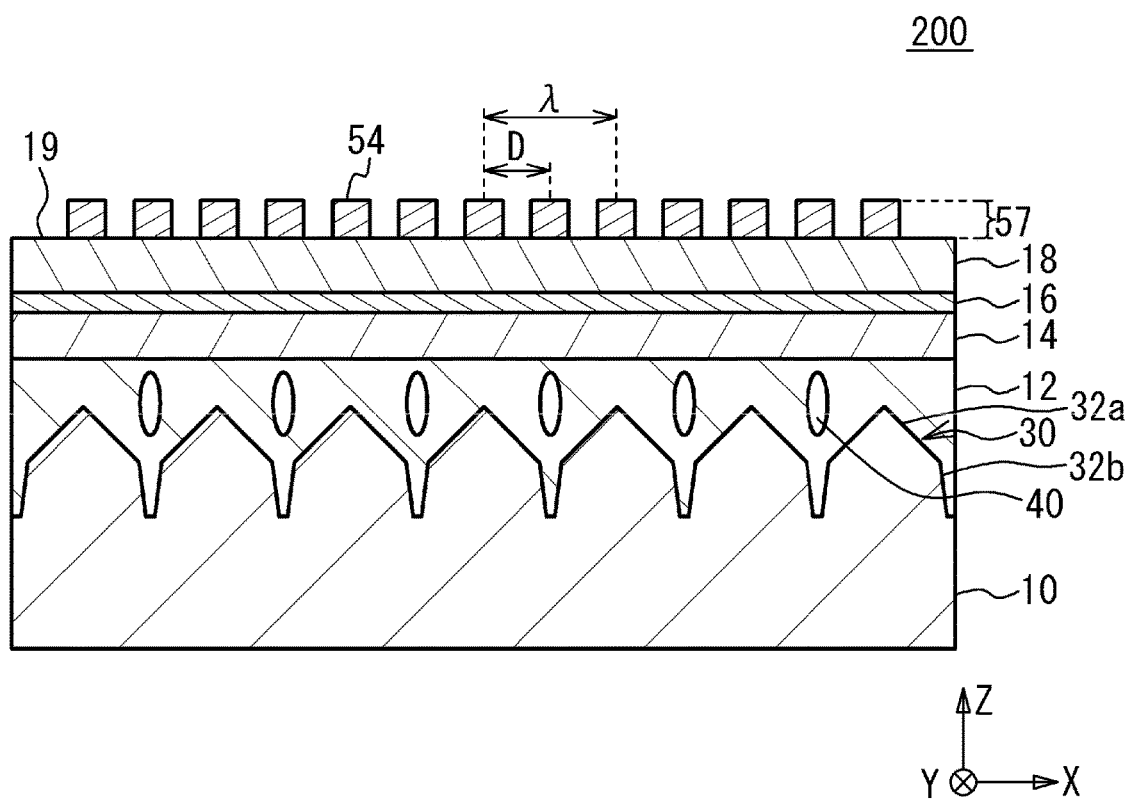
FIG. 11 is a cross-sectional view of an acoustic wave device in accordance with a second embodiment.

FIG. 11 is a cross-sectional view of an acoustic wave device 200 in accordance with a second embodiment. As illustrated in FIG. 11, in the acoustic wave device 200, void spaces 40 are formed in the boundary layer 12 between the adjacent protruding portions 30 and between the slopes 32a that are closest to the tips of the protruding portions 30 of the slopes 32a and 32b. Other structures are the same as those of the first embodiment, and the description thereof is thus omitted. The void spaces 40 are formed by forming the boundary layer 12 by, for example, sputtering while appropriately setting the film forming condition in the sputtering. The boundary layer 12 having the void spaces 40 may be formed by forming the boundary layer 12 using other methods.

In the second embodiment, the void spaces 40, which are arranged adjacent to the slopes 32a that are closest to the piezoelectric layer 18 of the slopes 32a and 32b forming the protruding portions 30, are formed in the boundary layer 12 in a cross-sectional view. The formation of the void spaces 40 in the boundary layer 12 allows the bulk wave to be scattered also by the void spaces 40 in addition to the bulk wave being scattered by the protruding portions 30 formed on the support substrate 10. Therefore, the bulk wave can be effectively scattered, and spurious emissions can be therefore reduced.

The first embodiment and the second embodiment describe a case in which three insulating layers: the boundary layer 12, the temperature compensation layer 14, and the bonding layer 16 are provided between the support substrate 10 and the piezoelectric layer 18, but only one insulating layer may be provided between the support substrate 10 and the piezoelectric layer 18.

Third Embodiment

Figure 12A:
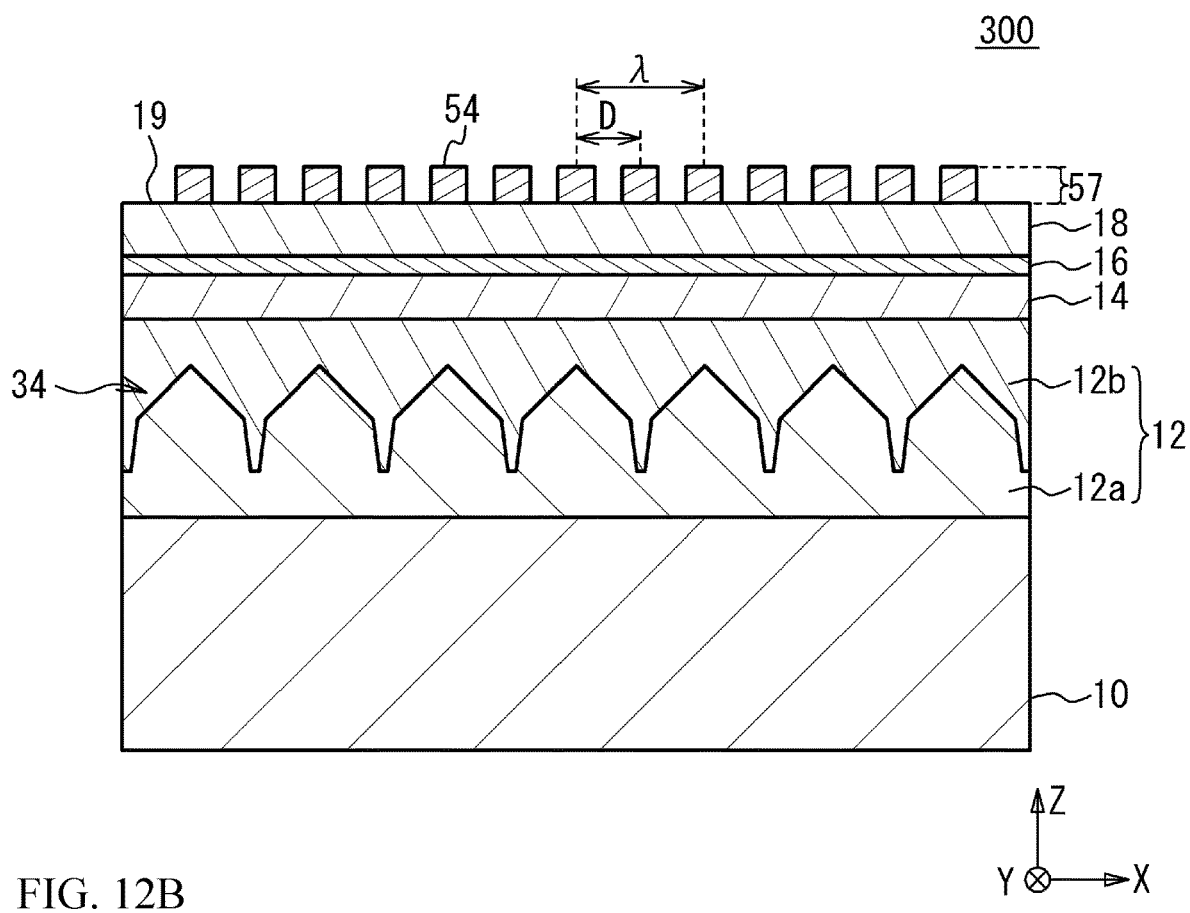
FIG. 12A is a cross-sectional view of an acoustic wave device in accordance with a third embodiment.
Figure 12B:
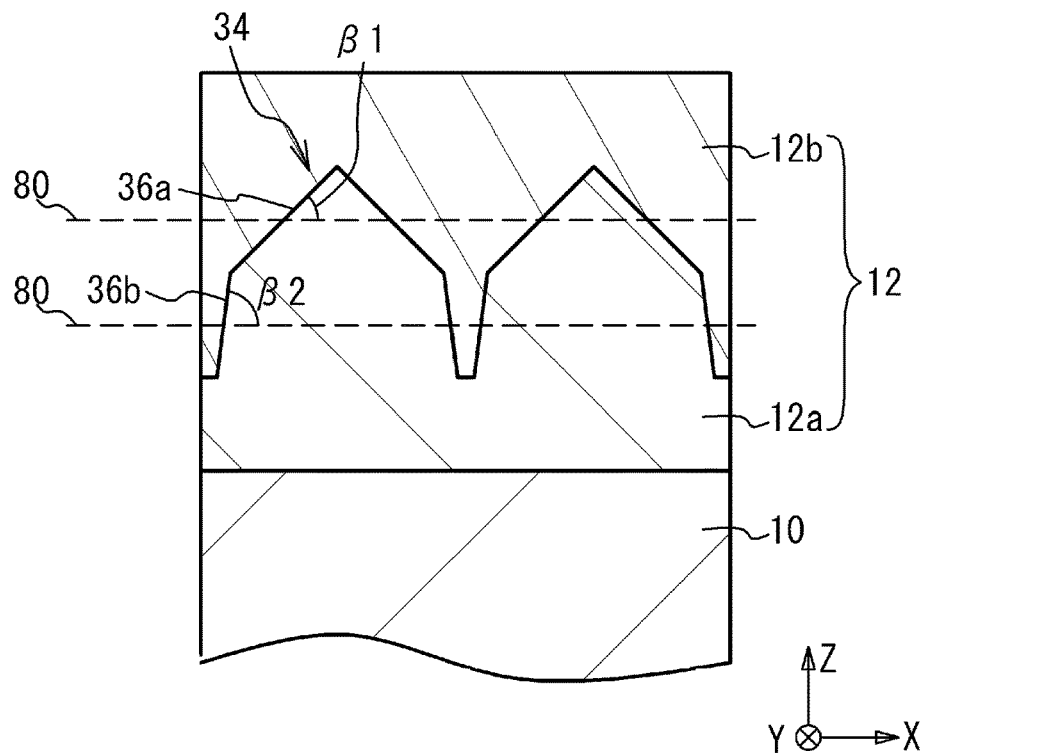
FIG. 12B is an enlarged cross-sectional view of the vicinity of protruding portions formed on a boundary layer in the third embodiment.

FIG. 12A is a cross-sectional view of an acoustic wave device 300 in accordance with a third embodiment, and FIG. 12B is an enlarged cross-sectional view of the vicinity of protruding portions 34 formed in the boundary layer 12 in the third embodiment. As illustrated in FIG. 12A and FIG. 12B, in the acoustic wave device 300, the boundary layer 12 includes a lower layer 12a and an upper layer 12b. The boundary face between the lower layer 12a and the support substrate 10 is flat. The boundary face between the lower layer 12a and the upper layer 12b is uneven. Protruding portions 34 are formed on the upper surface of the lower layer 12a. The protruding portions 34 are regularly arranged.

Each of the protruding portions 34 provided on the lower layer 12a has a shape in which each of the left and right side surfaces has linear slopes 36a and 36b that are inclined at different angles with respect to the surface 19, on which the comb-shaped electrodes 53 are provided, of the piezoelectric layer 18 in a cross-sectional view. The slope 36a is a slope that forms a step closer to the tip of the protruding portion 34, and the slope 36b is a slope that forms a step farther from the tip of the protruding portion 34. Each step may be formed of only the linear slopes 36a and 36b, or may partially include a curved portion. The linear slope is not limited to a completely straight slope, and may be a substantially linear slope having a curvature or a level difference within the manufacturing error. The angle β1 between the virtual straight line 80 and the slope 36a and the angle β2 between the virtual straight line 80 and the slope 36b are equal to or greater than 45° and less than 90°. The angle β1 between the virtual straight line 80 and the slope 36a is smaller than the angle β2 between the virtual straight line 80 and the slope 36b. The angle β1 corresponds to a first angle, which is the slope angle of the slope 36a, of two angles between the slope 36a and the surface 19 of the piezoelectric layer 18. In other words, the angle β1 is an angle that is inside the lower layer 12a of two angles between the slope 36a and the surface 19 of the piezoelectric layer 18. The angle β2 corresponds to a second angle, which is the slope angle of the slope 36a, of two angles between the slope 36b and the surface 19 of the piezoelectric layer 18. In other words, the angle β2 is an angle that is inside the lower layer 12a of two angles between the slope 36b and the surface 19 of the piezoelectric layer 18. Other structures are the same as those of the first embodiment, and the description thereof is thus omitted. The protruding portions 34 formed on the lower layer 12a are formed by the same method as the protruding portions 30 formed on the support substrate 10 in the first embodiment.

In the third embodiment, the protruding portions 34 are formed on the upper surface of the lower layer 12a (a first insulating layer) of the boundary layer 12. Each of the protruding portions 34 has a shape in which each of the left and right side surfaces has the linear slopes 36a and 36b that are inclined at different angles with respect to the surface 19 of the piezoelectric layer 18 in a cross-sectional view. The upper layer 12b (a second insulating layer) of the boundary layer 12 is disposed on the upper surface of the lower layer 12a, and the piezoelectric layer 18 is disposed on the upper layer 12b. On the piezoelectric layer 18, provided is a pair of the comb-shaped electrodes 53 having the electrode fingers 54 that excite an acoustic wave. This structure allows the bulk wave to be effectively scattered as in the first embodiment, and spurious emissions are thereby reduced.

Also in the third embodiment, the recessed portions, instead of the protruding portions 34, may be formed on the upper surface of the lower layer 12a as in the first embodiment. The protruding portions 34 and the recessed portions may be arranged in the same manner as in FIG. 9A to FIG. 9C, or FIG. 10A to FIG. 10C. In addition, also in the third embodiment, the insulating layers provided between the lower layer 12a of the boundary layer 12 and the piezoelectric layer 18 are not limited to three insulating layers: the upper layer 12b of the boundary layer 12, the temperature compensation layer 14, and the bonding layer 16, and one insulating layer may be provided between the lower layer 12a of the boundary layer 12 and the piezoelectric layer 18.

Fourth Embodiment

Figure 13A:
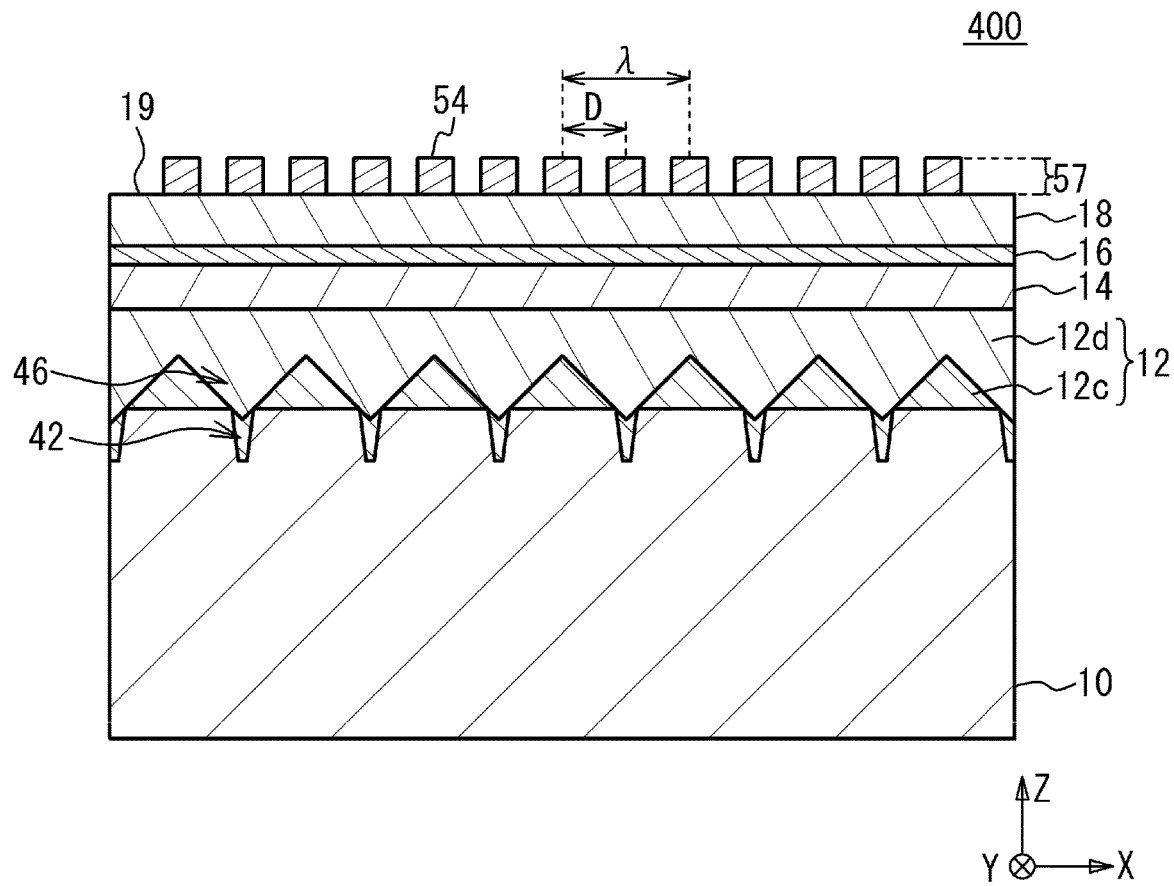
FIG. 13A is a cross-sectional view of an acoustic wave device in accordance with a fourth embodiment.
Figure 13B:
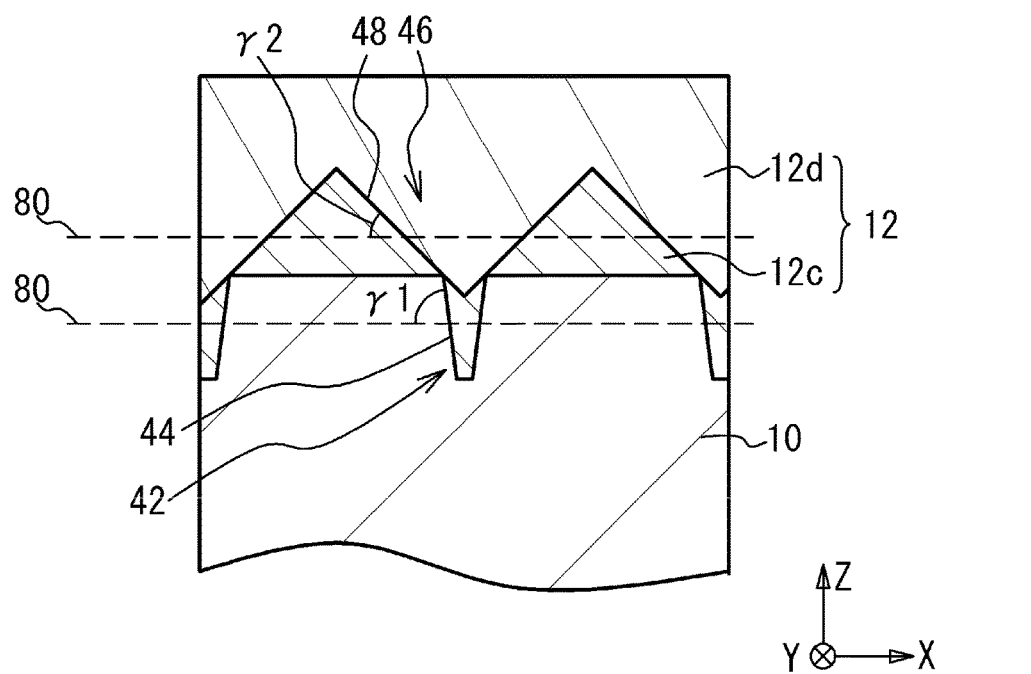
FIG. 13B is an enlarged cross-sectional view of the vicinity of recessed portions formed on the support substrate and recessed portions formed on a lower layer of a boundary layer in the fourth embodiment.

FIG. 13A is a cross-sectional view of an acoustic wave device 400 in accordance with a fourth embodiment, and FIG. 13B is an enlarged cross-sectional view of the vicinity of recessed portions 42 formed on the support substrate 10 and recessed portions 46 formed on a lower layer 12c of the boundary layer 12 in the fourth embodiment. As illustrated in FIG. 13A and FIG. 13B, in the acoustic wave device 400, the recessed portions 42 are formed on the support substrate 10. The recessed portion 42 has a shape in which each of the left and right side surfaces has a linear slope 44 inclined at a constant angle with respect to the surface 19, on which the comb-shaped electrodes 53 are provided, of the piezoelectric layer 18 in a cross-sectional view. The boundary layer 12 formed on the upper surface of the support substrate 10 includes the lower layer 12c and an upper layer 12d. The lower layer 12c is formed on the upper surface of the support substrate 10 so as to fill in at least a part of the recessed portion 42 formed on the support substrate 10, and the recessed portions 46 are formed. The side surface of the recessed portion 46 is continuous with the side surface of the recessed portion 42. The recessed portion 46 has a shape in which each of the left and right side surfaces has a linear slope 48 inclined at an angle different from an angle at which the slope 44 of the recessed portion 42 is inclined with respect to the surface 19, on which the comb-shaped electrodes 53 are provided, of the piezoelectric layer 18 in a cross-sectional view.

The angle γ1 between the virtual straight line 80 and the slope 44 and the angle γ2 between the virtual straight line 80 and the slope 48 are equal to or greater than 45° and less than 90°. The angle γ1 between the virtual straight line 80 and the slope 44 is smaller than the angle γ2 between the virtual straight line 80 and the slope 48. The angle γ1 corresponds to a first angle, which is the slope angle of the slope 44, of two angles between the slope 44 and the surface 19 of the piezoelectric layer 18. In other words, the angle γ1 is an angle that is inside the support substrate 10 of two angles between the slope 44 and the surface 19 of the piezoelectric layer 18. The angle γ2 corresponds to a second angle, which is the slope angle of the slope 48, of two angles between the slope 48 and the surface 19 of the piezoelectric layer 18. In other words, the angle γ2 is an angle that is inside the lower layer 12c of two angles between the slope 48 and the surface 19 of the piezoelectric layer 18. The upper layer 12d is disposed on the lower layer 12c so as to fill in the recessed portions 46. Other structures are the same as those of the first embodiment, and the description thereof is thus omitted. The recessed portions 46 of the lower layer 12c are formed in the following manner. The lower layer 12c is formed on the support substrate 10 so as to fill in the recessed portions 42 formed on the support substrate 10. Then, the lower layer 12c is flattened by CMP, for example. Thereafter, the lower layer 12c above the recessed portions 42 is removed by etching, for example. Through this process, the recessed portions 46 of the lower layer 12c are formed.

In the fourth embodiment, the support substrate 10 (a first insulating layer) has the recessed portions 42 formed on the upper surface thereof, and each of the recessed portions 42 has a shape in which each of the left and right side surfaces has the linear slope 44 (a first straight slope) inclined with respect to the surface 19 of the piezoelectric layer 18 in a cross-sectional view. The lower layer 12c (a second insulating layer) of the boundary layer 12 is disposed on the upper surface of the support substrate 10, and the recessed portions 46 having the side surfaces that are continuous with the side surfaces of the recessed portions 42 are formed. The recessed portion 46 has a shape in which each of the left and right side surfaces has the linear slope 48 (a second straight slope) that is inclined at an angle different from an angle at which the slope 44 is inclined with respect to the surface 19 of the piezoelectric layer 18 in a cross-sectional view. The piezoelectric layer 18 is disposed on the upper layer 12d, and a pair of the comb-shaped electrodes 53 having the electrode fingers 54 that excite an acoustic wave is provided on the piezoelectric layer 18. Accordingly, the recessed portion 42 and the recessed portion 46 form a recessed portion having a shape in which each of the left and right side surfaces has the linear slopes 44 and 48 inclined at different angles in a cross-sectional view. This structure allows the bulk wave to be effectively scattered, and spurious emissions are thereby reduced.

The fourth embodiment describes a case in which the recessed portions 42 are formed on the support substrate 10 and the recessed portions 46 are formed on the lower layer 12c of the boundary layer 12. However, also acceptable is a case in which the upper surface of the support substrate 10 is flat, the recessed portions 42 are formed on the lower layer 12c of the boundary layer 12, and the recessed portions 46 are formed on the upper layer 12d of the boundary layer 12. In this case, the boundary layer 12 preferably includes an uppermost layer having a flat upper surface on the upper layer 12d. In addition, in the fourth embodiment, the insulating layers provided between the lower layer 12c of the boundary layer 12 and the piezoelectric layer 18 are not limited to three insulating layers: the upper layer 12d of the boundary layer 12, the temperature compensation layer 14, and the bonding layer 16, and one insulating layer may be provided between the lower layer 12c of the boundary layer 12 and the piezoelectric layer 18.

Fifth Embodiment

Figure 14:
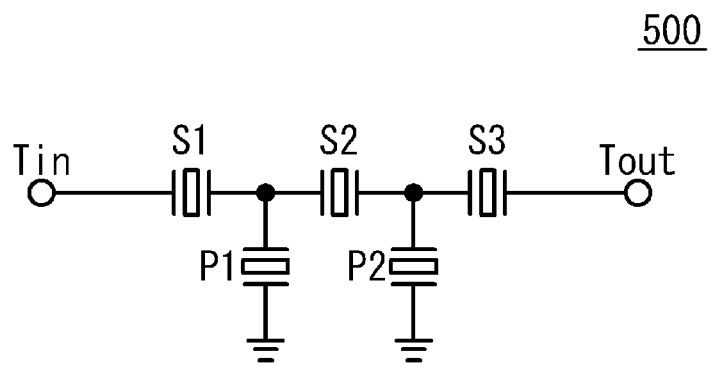
FIG. 14 is a circuit diagram of a filter in accordance with a fifth embodiment.

FIG. 14 is a circuit diagram of a filter 500 in accordance with a fifth embodiment. As illustrated in FIG. 14, in the filter 500, one or more series resonators Si to S3 are connected in series between an input terminal Tin and an output terminal Tout. One or more parallel resonators P1 and P2 are connected in parallel between the input terminal Tin and the output terminal Tout. The acoustic wave devices of the first embodiment to the fourth embodiment may be used for at least one of the one or more series resonators Si to S3, at least one of the one or more parallel resonators P1 and P2, or any combination of the one or more series resonators S1 to S3 and the one or more parallel resonators P1 and P2. The number of resonators included in the ladder-type filter can be freely selected. The filter may be a multimode filter.

Sixth Embodiment

Figure 15:
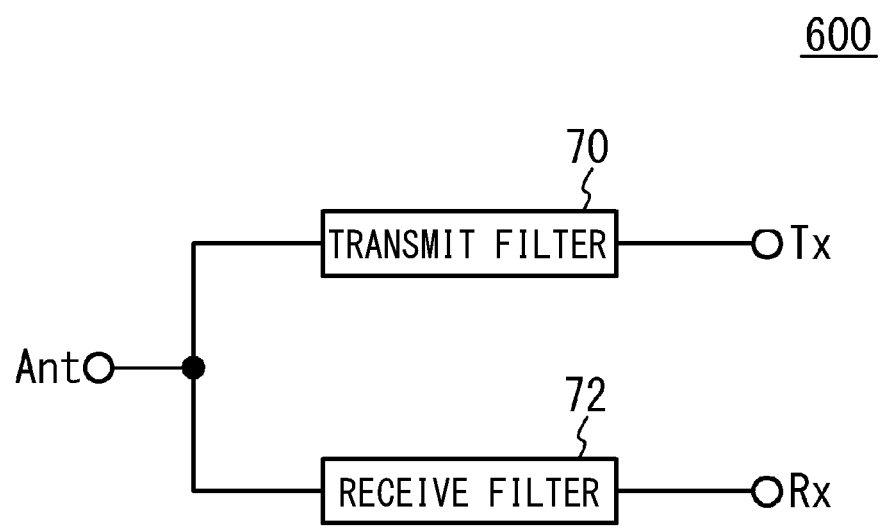
FIG. 15 is a block diagram of a duplexer in accordance with a sixth embodiment.

FIG. 15 is a block diagram of a duplexer 600 in accordance with a sixth embodiment. As illustrated in FIG. 15, in the duplexer 600, a transmit filter 70 is connected between a common terminal Ant and a transmit terminal Tx. A receive filter 72 is connected between the common terminal Ant and a receive terminal Rx. The transmit filter 70 transmits signals in the transmit band as transmission signals to the common terminal Ant among high-frequency signals input from the transmit terminal Tx, and suppresses signals with other frequencies. The receive filter 72 transmits signals in the receive band as reception signals to the receive terminal Rx among high-frequency signals input from the common terminal Ant, and suppresses signals with other frequencies. The transmit filter 70, the receive filter 72, or the transmit filter 70 and the receive filter 72 may be the filter of the fifth embodiment.

A duplexer has been described as an example of the multiplexer, but the multiplexer may be a triplexer or a quadplexer.

Although the embodiments of the present invention have been described in detail, the present invention is not limited to such a specific embodiment, and it is to be understood that the various change, substitutions, and alterations could be made hereto without departing from the spirit and scope of the invention.

What is claimed is:

1. An acoustic wave device comprising:
a piezoelectric layer;
a pair of comb-shaped electrodes disposed on a first surface of the piezoelectric layer, each of the pair of comb-shaped electrodes including electrode fingers that excite an acoustic wave;
a first insulating layer that is disposed at a second surface side of the piezoelectric layer, and has protruding portions and/or recessed portions on a third surface, which is closer to the piezoelectric layer, of the first insulating layer, each of the protruding portions and/or the recessed portions having a shape in which each of left and right side surfaces has linear slopes inclined at different angles with respect to the first surface of the piezoelectric layer in a cross-sectional view; and
a second insulating layer located between the piezoelectric layer and the first insulating layer and disposed on the third surface, on which the protruding portions and/or the recessed portions are formed, of the first insulating layer.

2. The acoustic wave device according to claim 1, wherein the linear slopes include a first linear slope and a second linear slope,
wherein a first angle of two angles between the first linear slope and the first surface of the piezoelectric layer in a cross-sectional view is equal to or greater than 45° and less than 90°, the first angle being a slope angle of the first linear slope with respect to the first surface of the piezoelectric layer in the cross-sectional view, and
wherein a second angle of two angles between the second linear slope and the first surface of the piezoelectric layer in a cross-sectional view is equal to or greater than 45° and less than 90°, the second angle being a slope angle of the second linear slope with respect to the first surface of the piezoelectric layer in the cross-sectional view.

3. The acoustic wave device according to claim 2, wherein the second angle is greater than the first angle, the first linear slope being closer to the piezoelectric layer than the second linear slope.

4. The acoustic wave device according to claim 1, wherein the second insulating layer fills in bottom portions of the recessed portions and/or a bottom portion of a space formed between the adjacent protruding portions in a cross-sectional view.

5. The acoustic wave device according to claim 1, wherein the second insulating layer has void spaces arranged adjacent to linear slopes positioned closest to the piezoelectric layer among the linear slopes that form the protruding portions and/or the recessed portions in a cross-sectional view.

6. The acoustic wave device according to claim 1, wherein the first insulating layer is a support substrate that is composed of a sapphire substrate, a silicon substrate, a spinel substrate, a quartz substrate, a crystal substrate, an alumina substrate, or a silicon carbide substrate.

7. The acoustic wave device according to claim 1, further comprising a support substrate on a surface opposite from the second insulating layer of the first insulating layer, the support substrate being composed of a sapphire substrate, a silicon substrate, a spinel substrate, a quartz substrate, a crystal substrate, an alumina substrate, or a silicon carbide substrate.

8. The acoustic wave device according to claim 1, further comprising a third insulating layer mainly composed of a silicon oxide between the second insulating layer and the piezoelectric layer,
wherein an acoustic velocity of a bulk wave propagating through the second insulating layer is greater than an acoustic velocity of a bulk wave propagating through the third insulating layer.

9. A filter comprising:
the acoustic wave device according to claim 1.

10. A multiplexer comprising:
the filter according to claim 9.

11. An acoustic wave device comprising:
a piezoelectric layer;
a pair of comb-shaped electrodes disposed on a first surface of the piezoelectric layer, each of the pair of comb-shaped electrodes including electrode fingers that excite an acoustic wave;
a first insulating layer that is disposed at a second surface side of the piezoelectric layer, and has first recessed portions on a third surface, which is closer to the piezoelectric layer, of the first insulating layer, each of the first recessed portions having a shape in which each of right and left side surfaces has a first linear slope inclined with respect to the first surface of the piezoelectric layer in a cross-sectional view; and
a second insulating layer that is located between the piezoelectric layer and the first insulating layer, and has a second recessed portion that has a side surface that is continuous with a side surface of the first recessed portion and has a shape in which each of left and right side surfaces has a second linear slope inclined at an angle different from an angle at which the first linear slope is inclined with respect to the first surface of the piezoelectric layer in a cross-sectional view.

12. The acoustic wave device according to claim 11, wherein the first insulating layer is a support substrate that is composed of a sapphire substrate, a silicon substrate, a spinel substrate, a quartz substrate, a crystal substrate, an alumina substrate, or a silicon carbide substrate.

13. The acoustic wave device according to claim 11, further comprising a support substrate on a surface opposite from the second insulating layer of the first insulating layer, the support substrate being composed of a sapphire substrate, a silicon substrate, a spinel substrate, a quartz substrate, a crystal substrate, an alumina substrate, or a silicon carbide substrate.

14. The acoustic wave device according to claim 11, further comprising a third insulating layer mainly composed of a silicon oxide between the second insulating layer and the piezoelectric layer,
    wherein an acoustic velocity of a bulk wave propagating through the second insulating layer is greater than an acoustic velocity of a bulk wave propagating through the third insulating layer.

15. A filter comprising:
the acoustic wave device according to claim 11.

16. A multiplexer comprising:
the filter according to claim 15.

\* \* \* \* \*